(12) United States Patent
Lee et al.

(10) Patent No.: US 11,450,836 B2
(45) Date of Patent: Sep. 20, 2022

(54) DISPLAY DEVICE

(71) Applicant: Samsung Display Co., Ltd., Yongin-si (KR)

(72) Inventors: Jungwook Lee, Hwaseong-si (KR); Minjae Baek, Yongin-si (KR); Jinbo Shim, Yongin-si (KR); Jongwon Lee, Seongnam-si (KR); Wongu Cho, Hwaseong-si (KR); Sang Youn Han, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/081,997

(22) Filed: Oct. 27, 2020

(65) Prior Publication Data

US 2021/0288289 A1 Sep. 16, 2021

(30) Foreign Application Priority Data

Mar. 13, 2020 (KR) .......... 10-2020-0031177

(51) Int. Cl.
| | |
|---|---|
| *H01L 51/52* | (2006.01) |
| *G06F 3/044* | (2006.01) |
| *H01L 27/32* | (2006.01) |
| *G09G 3/3266* | (2016.01) |
| *G09G 3/3275* | (2016.01) |
| *G09G 3/3225* | (2016.01) |

(52) U.S. Cl.
CPC ........ *H01L 51/5271* (2013.01); *G06F 3/0446* (2019.05); *H01L 27/323* (2013.01); *H01L 27/3244* (2013.01); *G06F 2203/04103* (2013.01); *G06F 2203/04112* (2013.01); *G09G 3/3225* (2013.01); *G09G 3/3266* (2013.01); *G09G 3/3275* (2013.01); *G09G 2300/0426* (2013.01)

(58) Field of Classification Search
CPC ............ H01L 51/5271; H01L 27/1463; H01L 27/3246; G02F 1/133553; G02F 1/1335; G02F 2203/02; G02B 5/201; G02B 5/3058; G09G 2300/0426; G09G 2300/0456; G09G 2300/0465; G09G 2320/0233
USPC ................................... 345/170–178
See application file for complete search history.

(56) References Cited

U.S. PATENT DOCUMENTS

| | | | |
|---|---|---|---|
| 10,249,692 B2 | 4/2019 | Lee et al. | |
| 10,496,204 B2 | 12/2019 | Heo et al. | |
| 10,566,578 B2 | 2/2020 | Sakamoto et al. | |

(Continued)

FOREIGN PATENT DOCUMENTS

| | | |
|---|---|---|
| KR | 10-0712291 | 4/2007 |
| KR | 10-2017-0110012 | 10/2017 |

(Continued)

*Primary Examiner* — Dong Hui Liang
(74) *Attorney, Agent, or Firm* — H.C. Park & Associates, PLC

(57) ABSTRACT

A display device including a display panel having a light emitting area and a non-light emitting area around the light emitting area, a first conductive pattern disposed in the non-light emitting area, a second conductive pattern disposed on the first conductive pattern, and a reflection pattern overlapping the non-light emitting area and disposed between the light emitting area and the second conductive pattern.

19 Claims, 18 Drawing Sheets

(56) References Cited

U.S. PATENT DOCUMENTS

| | | | | |
|---|---|---|---|---|
| 2006/0038752 A1* | 2/2006 | Winters | ............... | G09G 3/3225 345/76 |
| 2010/0207107 A1* | 8/2010 | Kim | ..................... | H01L 51/525 257/40 |
| 2011/0019050 A1* | 1/2011 | Yamashita | .......... | H01L 27/1463 348/308 |
| 2011/0241539 A1* | 10/2011 | Yan | ..................... | H01L 51/5284 313/504 |
| 2013/0050619 A1* | 2/2013 | Kim | .................... | G02F 1/13394 349/106 |
| 2014/0253856 A1* | 9/2014 | Nakahata | .............. | H01L 51/525 349/139 |
| 2014/0319470 A1* | 10/2014 | Kim | .................... | H01L 51/5271 257/40 |
| 2015/0041777 A1* | 2/2015 | Chung | ................ | H01L 51/5271 257/40 |
| 2015/0090991 A1* | 4/2015 | Ishii | .................... | H01L 27/3272 257/40 |
| 2015/0162386 A1* | 6/2015 | Furuie | ................. | H01L 51/5284 257/40 |
| 2015/0162387 A1* | 6/2015 | Gu | ........................ | G06F 3/0412 345/174 |
| 2016/0013254 A1* | 1/2016 | Ishii | ...................... | H01L 51/525 257/88 |
| 2016/0155789 A1* | 6/2016 | Kim | .................... | H01L 51/5271 257/40 |
| 2016/0291374 A1* | 10/2016 | Fan | ...................... | G02F 1/13394 |
| 2017/0097710 A1* | 4/2017 | Bok | ...................... | H01L 27/323 |
| 2017/0205959 A1* | 7/2017 | Seong | .................. | G06F 3/0448 |
| 2017/0214003 A1* | 7/2017 | Lee | ..................... | H01L 51/5271 |
| 2018/0011385 A1* | 1/2018 | Kang | .................. | H01L 27/3246 |
| 2019/0115404 A1* | 4/2019 | Moon | .................. | H01L 27/124 |
| 2019/0331962 A1* | 10/2019 | Wu | ....................... | G02F 1/13439 |
| 2020/0041842 A1* | 2/2020 | Jeong | ................ | G02F 1/133524 |

FOREIGN PATENT DOCUMENTS

| | | |
|---|---|---|
| KR | 10-2018-0011919 | 2/2018 |
| KR | 10-2018-0078669 | 7/2018 |
| KR | 10-2019-0041558 | 4/2019 |
| KR | 10-2019-0079249 | 7/2019 |

* cited by examiner

FIG. 2
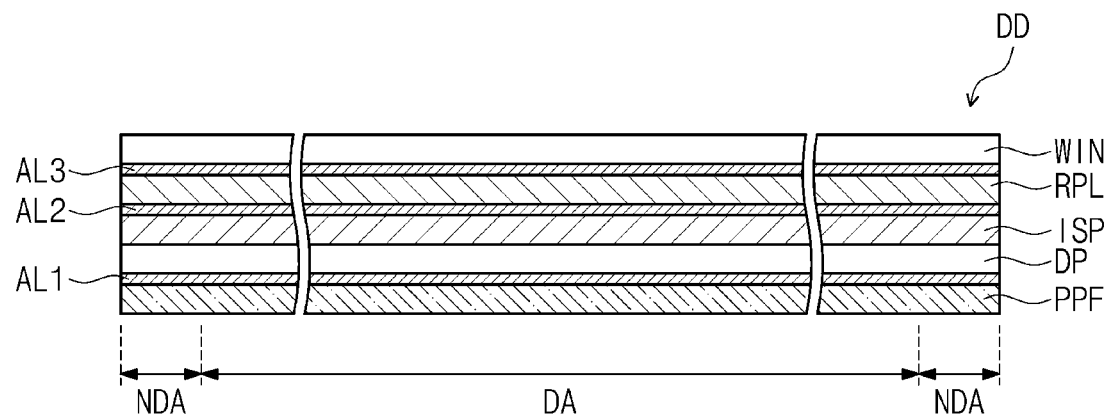
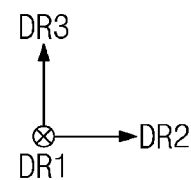
FIG. 3
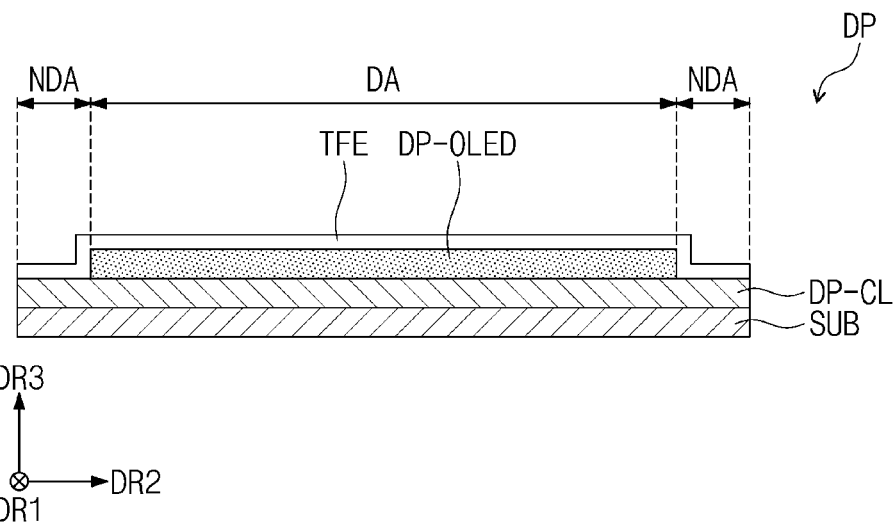
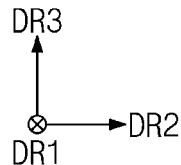

FIG. 4
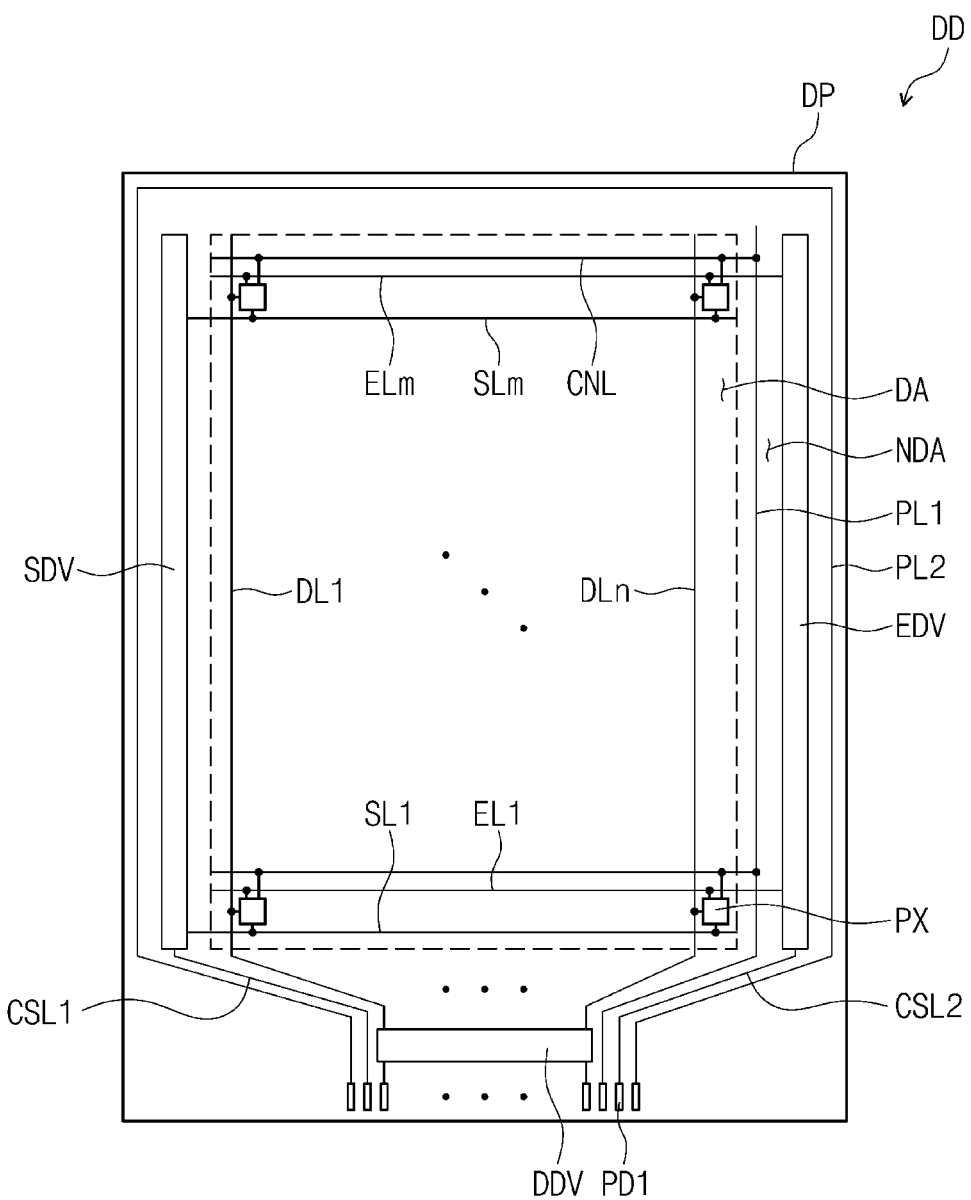
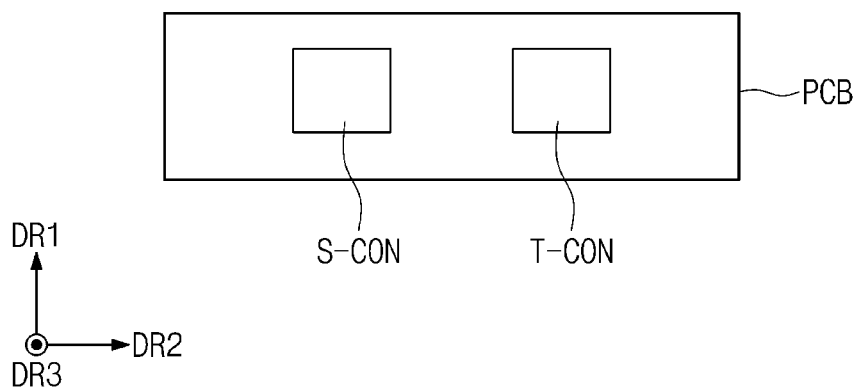

FIG. 7
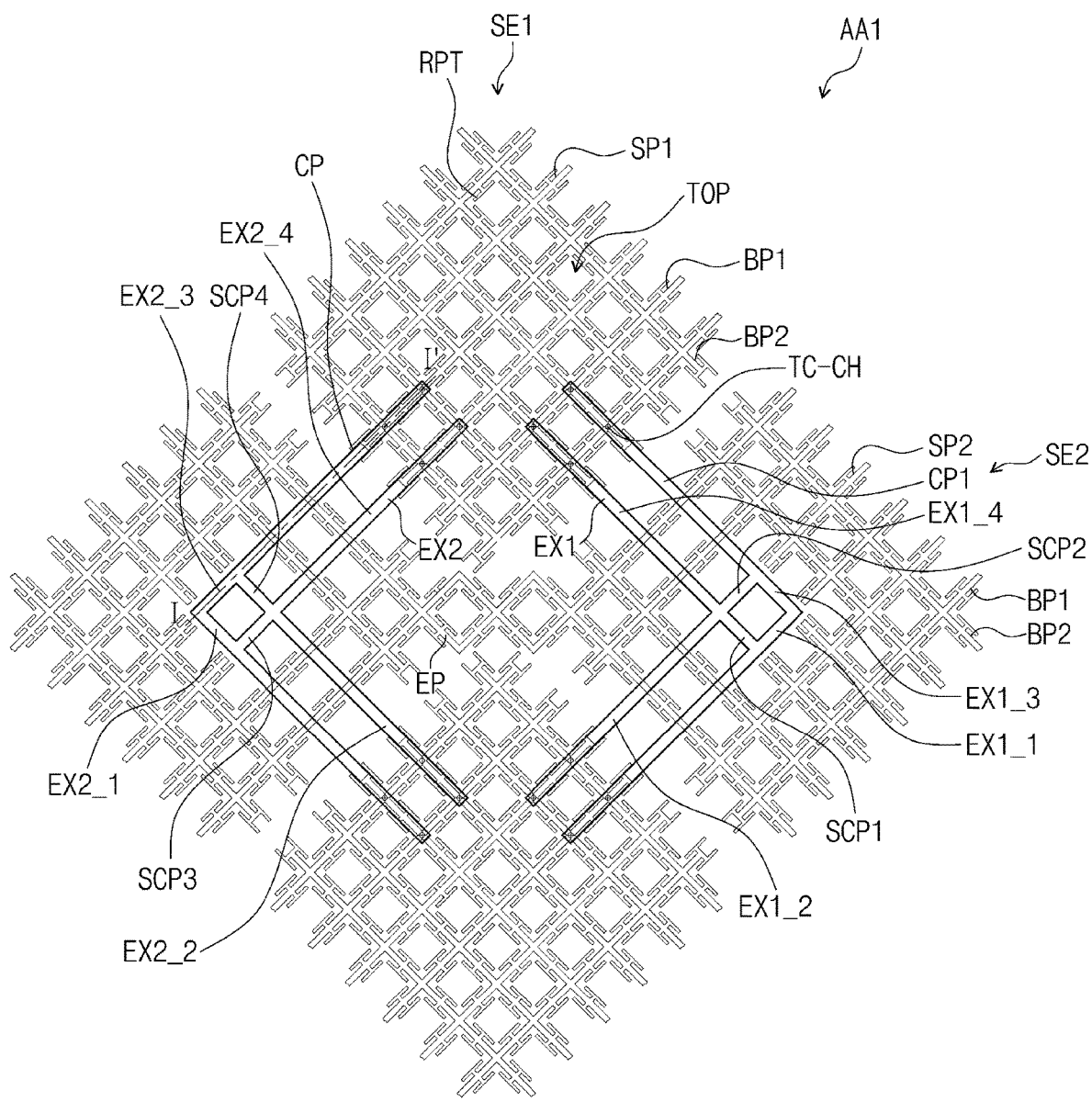
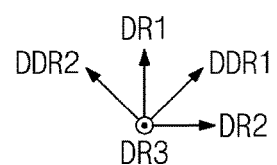

FIG. 18
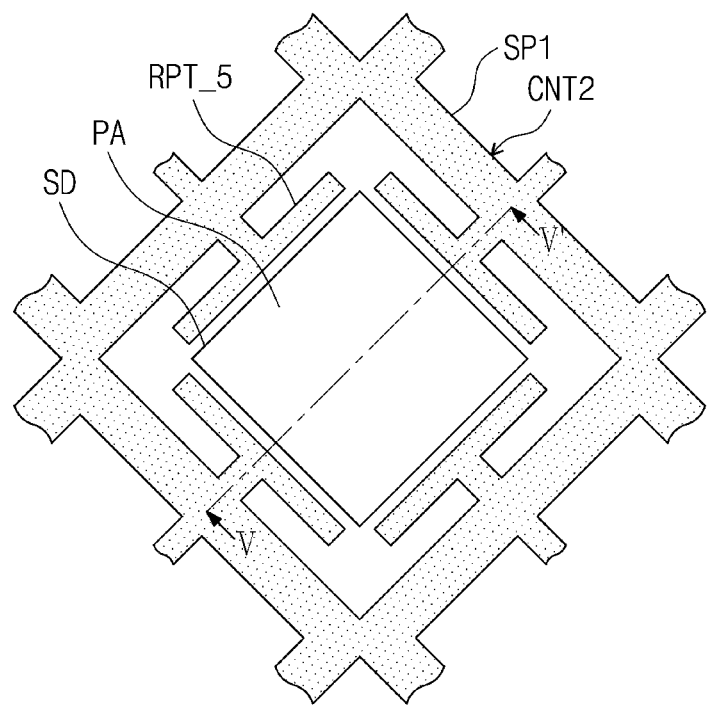
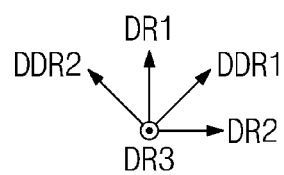

DISPLAY DEVICE

CROSS-REFERENCE TO RELATED APPLICATION

This application claims priority from and the benefit of Korean Patent Application No. 10-2020-0031177, filed on Mar. 13, 2020, which is hereby incorporated by reference for all purposes as if fully set forth herein.

BACKGROUND

Field

Exemplary embodiments of the invention relate generally to a display device.

Discussion of the Background

An electronic device, such as a smartphone, a digital camera, a laptop computer, a navigation device, and a smart TV, which provides an image to a user, generally includes a display device for displaying the image. The display device generates an image and provides the generated image to a user through a display screen.

In general, a display device includes a display panel generating an image and an input sensing unit disposed on the display panel to sense an external input. The display panel includes a light emitting area generating light for displaying an image and a non-light emitting area around the light emitting area. The input sensing unit includes a plurality of sensing electrodes for sensing an external input. The sensing electrodes are disposed in the non-light emitting area.

Light generated in the light emitting area travels not only toward the front of the display device but also toward the left and right of the display device. Accordingly, there is a need to develop a technology for improving the front luminance of the display device by increasing the amount of light moving toward the front of the display device.

The above information disclosed in this Background section is only for understanding of the background of the inventive concepts, and, therefore, it may contain information that does not constitute prior art.

SUMMARY

Display devices constructed according to exemplary embodiments of the invention are capable of improving front luminance.

Exemplary embodiment also provide a display device capable of reducing the thickness of the display device and preventing degradation in touch sensitivity.

Additional features of the inventive concepts will be set forth in the description which follows, and in part will be apparent from the description, or may be learned by practice of the inventive concepts.

A display device according to an exemplary embodiment includes a display panel including a light emitting area and a non-light emitting area around the light emitting area, a first conductive pattern disposed in the non-light emitting area, a second conductive pattern disposed on the first conductive pattern, and a reflection pattern overlapping the non-light emitting area and disposed between the light emitting area and the second conductive pattern.

A display device according to another exemplary embodiment includes a display panel including a light emitting area and a non-light emitting area around the light emitting area, a first conductive pattern disposed in the non-light emitting area, a second conductive pattern disposed on the first conductive pattern, a first sub-reflection pattern disposed between the second conductive pattern and the light emitting area, and a second sub-reflection pattern disposed below the first sub-reflection pattern, in which one side surface of the first sub-reflection pattern adjacent to the light emitting area and one side surface of the second sub-reflection pattern adjacent to the light emitting area are inclined.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 2 is an exemplary cross-sectional view of the display device of FIG. 1.

FIG. 3 is an exemplary cross-sectional view of the display panel of FIG. 2.

FIG. 4 is a plan view of the display panel of FIG. 3.

FIG. 7 is an enlarged view of the first area AA1 of FIG. 6.

FIG. 18 illustrates reflection patterns according to another exemplary embodiment.

DETAILED DESCRIPTION

Figure 1:
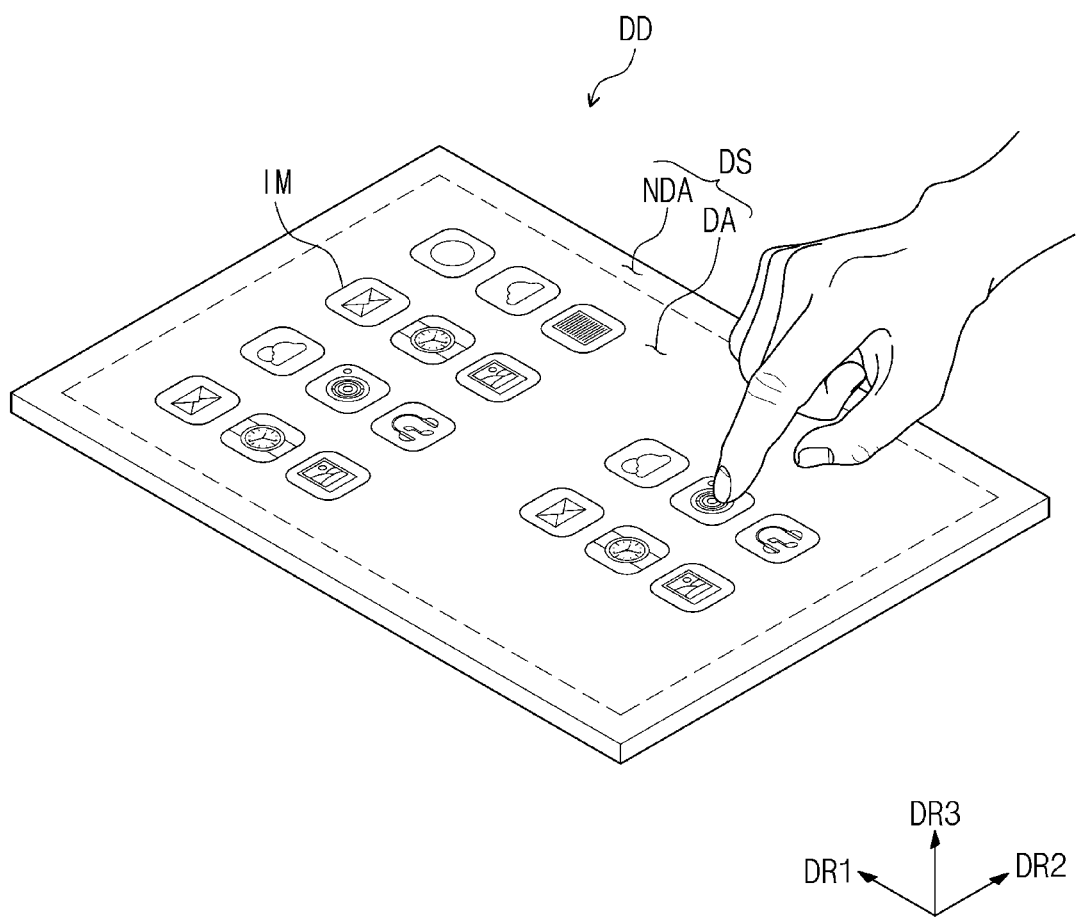
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of a display device according to an exemplary embodiment.

Referring to FIG. 1, a display device DD according to an exemplary embodiment may have substantially a rectangular shape having long sides extending in a first direction DR1 and short sides extending in a second direction DR2 crossing the first direction DR1. However, the display device DD is not limited thereto, and may have various shapes, such as a circular or polygonal shape.

Hereinafter, a direction substantially perpendicular to a plane defined by the first direction DR1 and the second direction DR2 w defined as a third direction DR3. As used herein, "when viewed in a plane" refers to a state viewed in the third direction DR3.

A top surface of the display device DD may be defined as a display surface DS, and may have a plane defined by the first direction DR1 and the second direction DR2. Images IM generated in the display device DD may be provided to a user through the display surface DS.

The display surface DS may include a display area DA and a non-display area NDA around the display area DA. The display area DA may display an image, and the non-display area NDA may not display an image. The non-display area NDA may be printed in a predetermined color and surround the display area DA to define the edge of the display device DD.

The display device DD may be used in large-sized electronic devices, such as a television, a monitor, and an outdoor digital signage. In addition, the display device DD may be used in medium- and small-sized electronic devices, such as a personal computer, a laptop computer, a personal digital assistant, a car navigation device, a game machine, a smartphone, a tablet computer, and a camera. However, the inventive concepts are not limited thereto, and the display device DD may be employed in other electronic devices in other exemplary embodiments.

FIG. 2 is an exemplary cross-sectional view of the display device of FIG. 1.

FIG. 2 illustrates a cross-section of the display device DD viewed in the first direction DR1.

Referring to FIG. 2, the display device DD may include a display panel DP, an input sensing unit ISP, an anti-reflection layer RPL, a window WIN, a panel protective film PPF, and first to third adhesive layers AL1 to AL3.

The display panel DP may be a flexible display panel. The display panel DP according to an exemplary embodiment may be a light emitting display panel, without being limited thereto. For example, the display panel DP may be an organic light emitting display panel or a quantum dot light emitting display panel. A light emitting layer of an organic light emitting display panel may include an organic light emitting material. A light emitting layer of a quantum dot light emitting display panel may include a quantum dot, a quantum rod, or the like. Hereinafter, the display panel DP will exemplarily be described as an organic light emitting display panel.

The input sensing unit ISP may be disposed on the display panel DP. The input sensing unit ISP may include a plurality of sensors for sensing an external input in a capacitive method. The input sensing unit ISP may be formed directly on the display panel DP when the display panel DP is manufactured. However, the inventive concepts are not limited thereto, and in some exemplary embodiments, the input sensing unit ISP may be manufactured as a panel separate from the display panel DP to be attached to the display panel DP by an adhesive layer.

The anti-reflection layer RPL may be disposed on the input sensing unit ISP. The anti-reflection layer RPL may reduce the reflectance of external light incident on the display panel DP from above the display device DD. For example, the anti-reflection layer RPL may include a phase retarder and/or a polarizer.

The window WIN may be disposed on the anti-reflection layer RPL. The window WIN may protect the display panel DP, the input sensing unit ISP, and the anti-reflection layer RPL from scratches and impacts from the outside.

The panel protective film PPF may be disposed below the display panel DP. The panel protective film PPF may protect a lower portion of the display panel DP. The panel protective film PPF may include a flexible plastic material, such as polyethylene terephthalate (PET).

The first adhesive layer AL1 may be disposed between the display panel DP and the panel protective film PPF. The display panel DP and the panel protective film PPF may be bonded to each other by the first adhesive layer AL1. The second adhesive layer AL2 may be disposed between the anti-reflection layer RPL and the input sensing unit ISP. The anti-reflection layer RPL and the input sensing unit ISP may be bonded to each other by the second adhesive layer AL2. The third adhesive layer AL3 may be disposed between the window WIN and the anti-reflection layer RPL. The window WIN and the anti-reflection layer RPL may be bonded to each other by the third adhesive layer AL3.

FIG. 3 is an exemplary cross-sectional view of the display panel of FIG. 2.

FIG. 3 illustrates a cross-section of the display panel DP viewed in the first direction DR1.

Referring to FIG. 3, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display area DA and a non-display area NDA around the display area DA. The substrate SUB may include a flexible plastic material, such as polyimide (PI). The display element layer DP-OLED may be disposed in the display area DA.

A plurality of pixels may be arranged on the circuit element layer DP-CL and the display element layer DP-OLED. Each of the pixels may include a transistor disposed on the circuit element layer DP-CL and a light emitting element disposed on the display element layer DP-OLED and connected to the transistor. The configuration of the pixel will be described in more detail later.

The thin film encapsulation layer TFE may be disposed on the circuit element layer DP-CL to cover the display element layer DP-OLED. The thin film encapsulation layer TFE may include inorganic layers and an organic layer between the inorganic layers. The inorganic layers may protect the pixels from moisture/oxygen. The organic layer may protect the pixels from foreign matter, such as dust particles.

FIG. 4 is a plan view of the display panel of FIG. 3.

Referring to FIG. 4, the display device DD may include the display panel DP, a scan driver SDV, a data driver DDV, an emission driver EDV, a printed circuit board PCB, a timing controller T-CON, and a sensing controller S-CON.

The display panel DP may have substantially a rectangular shape having long sides extending in the first direction DR1 and short sides extending in the second direction DR2, but the inventive concepts are not limited to a particular shape of the display panel DP. The display panel DP may include a display area DA and a non-display area NDA surrounding the display area DA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, first and second power lines PL1 and PL2, connection lines CNL, and a plurality of first pads PD1. Here, m and n are natural numbers.

The pixels PX may be arranged in the display area DA. The scan driver SDV, the emission driver EDV, and the data driver DDV may be disposed in the non-display area NDA. For example, the scan driver SDV and the emission driver EDV may be disposed in the non-display area NDA adjacent to the long sides of the display panel DP, respectively.

The data driver DDV may be manufactured in the form of an integrated circuit chip and disposed in a portion of the non-display area NDA adjacent to one of the short sides of the display panel DP. When viewed in a plane, the data driver DDV may be adjacent to a lower end of the display panel DP.

However, the inventive concepts are not limited thereto, and in some exemplary embodiments, the scan driver SDV and the emission driver EDV may be disposed in the non-display area NDA adjacent to the short sides of the display panel DP, respectively, and the data driver DDV may be disposed in a portion of the non-display area NDA adjacent to one of the short sides of the display panel DP. In addition, the arrangement positions of the scan driver SDV, the emission driver EDV, and the data driver DDV may variously change according to the shape of the display panel DP.

The scan lines SL1 to SLm may extend in the second direction DR2 to be connected to the pixels PX and the scan driver SDV. The data lines DL1 to DLn may extend in the first direction DR1 to be connected to the pixels PX and the data driver DDV. The emission lines EL1 to ELm may extend in the second direction DR2 to be connected to the pixels PX and the emission driver EDV.

The first power line PL1 may extend in the first direction DR1 and be disposed in the non-display area NDA. Although the first power line PL1 is illustrated as being disposed between the display area DA and the emission driver EDV, in some exemplary embodiments, the first power line PL1 may be disposed between the display area DA and the scan driver SDV.

The connection lines CNL may be arranged in the display area DA, may extend in the second direction DR2 and be arranged in the first direction DR1. The connection lines CNL may be connected to the first power line PL1 and the pixels PX. A first voltage may be applied to the pixels PX through the first power line PL1 and the connection lines CNL connected to each other.

The second power line PL2 may be disposed in the non-display area NDA. The second power line PL2 may extend along the long sides of the display panel DP and one of the short sides of the display panel DP opposing the data driver DDV. The second power line PL2 may be disposed more outwardly than the scan driver SDV and the emission driver EDV.

Although not illustrated, the second power line PL2 may extend toward the display area DA to be connected to the pixels PX. A second voltage lower than the first voltage may be applied to the pixels PX through the second power line PL2.

The first control line CSL1 may be connected to the scan driver SDV, and may extend toward the lower end of the display panel DP when viewed in a plane. The second control line CSL2 may be connected to the emission driver EDV, and may extend toward the lower end of the display panel DP when viewed in a plane. The data driver DDV may be disposed between the first control line CSL1 and the second control line CSL2.

The first pads PD1 may be disposed closer to the lower end of the display panel DP than the data driver DDV. The data lines DL1 to DLn may be connected to the data driver DDV, and the data driver DDV may be connected to first pads PD1 corresponding to the data lines DL1 to DLn. The first power line PL1, the second power line PL2, the first control line CSL1, and the second control line CSL2 may be respectively connected to corresponding first pads PD1.

The printed circuit board PCB may be connected to the first pads PD1. The timing controller T-CON and the sensing controller S-CON may be manufactured as integrated circuit chips and mounted on the printed circuit board PCB. The timing controller T-CON may be connected to first pads PD1 connected to the data driver DDV and the first and second control lines CSL1 and CSL2 through the printed circuit board PCB. Although not illustrated, a voltage generator for generating the first and second voltages may be disposed on the printed circuit board PCB and connected to first pads PD1, which are connected to the first and second power lines PL1 and PL2.

The timing controller T-CON may generate a scan control signal, a data control signal, and an emission control signal. The scan control signal may be provided to the scan driver SDV through the first control line CSL1. The emission control signal may be provided to the emission driver EDV through the second control line CSL2. The data control signal may be provided to the data driver DDV. The timing controller T-CON may provide image signals to the data driver DDV.

The scan driver SDV may generate a plurality of scan signals in response to the scan control signal, and the scan signals may be applied to the pixels PX through the scan lines SL1 to SLm. The data driver DDV may generate a plurality of data voltages corresponding to the image signals in response to the data control signal. The data voltages may be applied to the pixels PX through the data lines DL1 to DLn. The emission driver EDV may generate a plurality of emission signals in response to the emission control signal, and the emission signals may be applied to the pixels PX through the emission lines EL1 to ELm.

The pixels PX may receive the data voltages in response to the scan signals. The pixels PX may display an image by emitting light having luminance that corresponds to the data voltages in response to the emission signals. The emission time of the pixels PX may be controlled by the emission signals.

The sensing controller S-CON may be connected to second and third pads of the input sensing unit ISP to be described below, through the printed circuit board PCB. The sensing controller S-CON may provide the input sensing unit ISP with sensing signals for driving the input sensing unit ISP.

Figure 5:
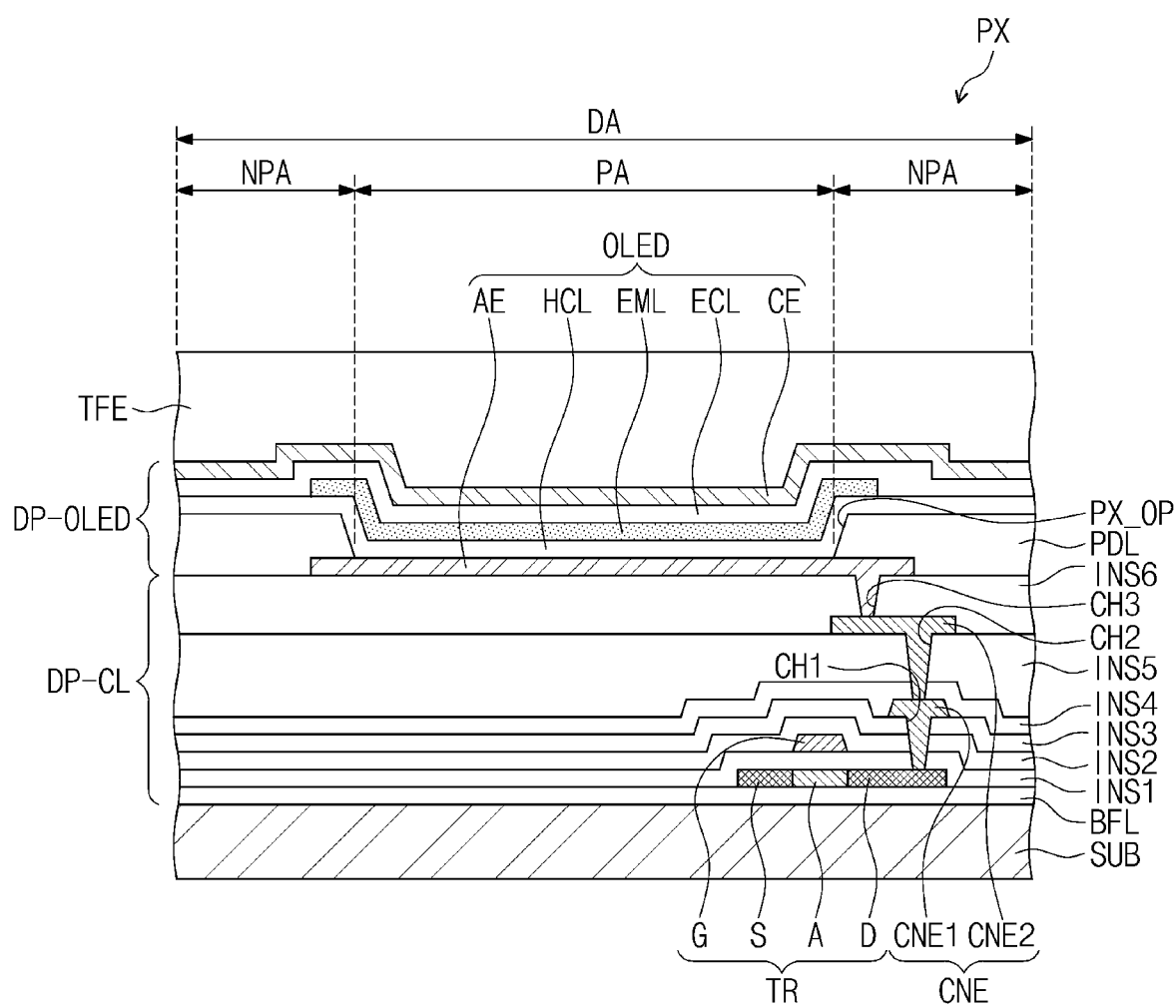
FIG. 5 is an exemplary cross-sectional view of one of the pixels of FIG. 4.

FIG. 5 is an exemplary cross-sectional view of one of the pixels of FIG. 4.

Referring to FIG. 5, each of the pixels PX may include a transistor TR and a light emitting element OLED. The light emitting element OLED may include a first electrode AE, a second electrode CE, a hole control layer HCL, an electron control layer ECL, and a light emitting layer EML. The first electrode AE may be an anode, and the second electrode CE may be a cathode.

The transistor TR and the light emitting element OLED may be disposed on the substrate SUB. Although FIG. 5 exemplarily illustrates one transistor TR, the pixel PX in other exemplary embodiments may include a plurality of transistors and at least one capacitor for driving the light emitting element OLED.

The display area DA may include a light emitting area PA corresponding to each of the pixels PX and a non-light emitting area NPA around the light emitting area PA. The light emitting area PA may be provided in plurality. The light emitting element OLED may be disposed in the light emitting area PA.

A buffer layer BFL may be disposed on the substrate SUB, and the buffer layer BFL may be an inorganic layer. A semiconductor pattern may be disposed on the buffer layer BFL. The semiconductor pattern may include polysilicon. However, the inventive concepts are not limited thereto, and in some exemplary embodiments, the semiconductor pattern may include amorphous silicon or a metal oxide.

The electrical properties of the semiconductor pattern may change depending on whether the semiconductor pattern is doped. The semiconductor pattern may include doped and non-doped regions. The doped region may be doped with an N-type dopant or a P-type dopant. The conductivity of the doped region is greater than that of the non-doped region, and the doped region may substantially function as a source electrode and a drain electrode of the transistor TR. The non-doped region may substantially correspond to an active region (or channel) of the transistor TR.

A source S, an active region A, and a drain D of the transistor TR may be formed from the semiconductor pattern. A first insulating layer INS1 may be disposed on the semiconductor pattern. A gate G of the transistor TR may be disposed on the first insulating layer INS1.

A second insulating layer INS2 may be disposed on the gate G. A third insulating layer INS3 may be disposed on the second insulating layer INS2. In some exemplary embodiments, a dummy electrode may be further disposed between the second insulating layer INS2 and the third insulating layer INS3. The dummy electrode may form a capacitor together with a metal pattern extending from the gate G.

A connection electrode CNE may be disposed between the transistor TR and the light emitting element OLED. The connection electrode CNE may connect the transistor TR and the light emitting element OLED. The connection electrode CNE may include a first connection electrode CNE1 and a second connection electrode CNE2 disposed on the first connection electrode CNE1.

The first connection electrode CNE1 may be disposed on the third insulating layer INS3, and may be connected to the drain D through a first contact hole CH1 defined in the first to third insulating layers INS1 to INS3. A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through a second contact hole CH2 defined in the fourth insulating layer INS4 and the fifth insulating layer INS5.

A sixth insulating layer INS6 may be disposed on the second connection electrode CNE2. The layers from the buffer layer BFL to the sixth insulating layer INS6 may be defined as the circuit element layer DP-CL. The first to sixth insulating layers INS1 to INS6 may be an inorganic layer or an organic layer.

The first electrode AE may be disposed on the sixth insulating layer INS6. The first electrode AE may be connected to the second connection electrode CNE2 through a third contact hole CH3 defined in the sixth insulating layer INS6. A pixel defining film PDL exposing a predetermined portion of the first electrode AE may be disposed on the first electrode AE and the sixth insulating layer INS6. An opening PX_OP for exposing the predetermined portion of the first electrode AE may be defined in the pixel defining film PDL.

The hole control layer HCL may be disposed on the first electrode AE and the pixel defining film PDL. The hole control layer HCL may be disposed in common in the light emitting area PA and the non-light emitting area NPA. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate light having any one of red, green, and blue color.

The electron control layer ECL may be disposed on the light emitting layer EML and the hole control layer HCL. The electron control layer ECL may be disposed in common in the light emitting area PA and the non-light emitting area NPA. The electron control layer ECL may include an electron transport layer and an electron injection layer.

The second electrode CE may be disposed on the electron control layer ECL. The second electrode CE may be disposed in common in the pixels PX. The thin film encapsulation layer TFE may be disposed on the light emitting element OLED. The layers in which the light emitting element OLED is disposed may be defined as the display element layer DP-OLED.

The first voltage may be applied to the first electrode AE through the transistor TR, and the second voltage may be applied to the second electrode CE. A hole and an electron injected into the light emitting layer EML may be combined to generate an exciton, and the light emitting element OLED may emit light as the exciton transitions to a ground state.

Figure 6:
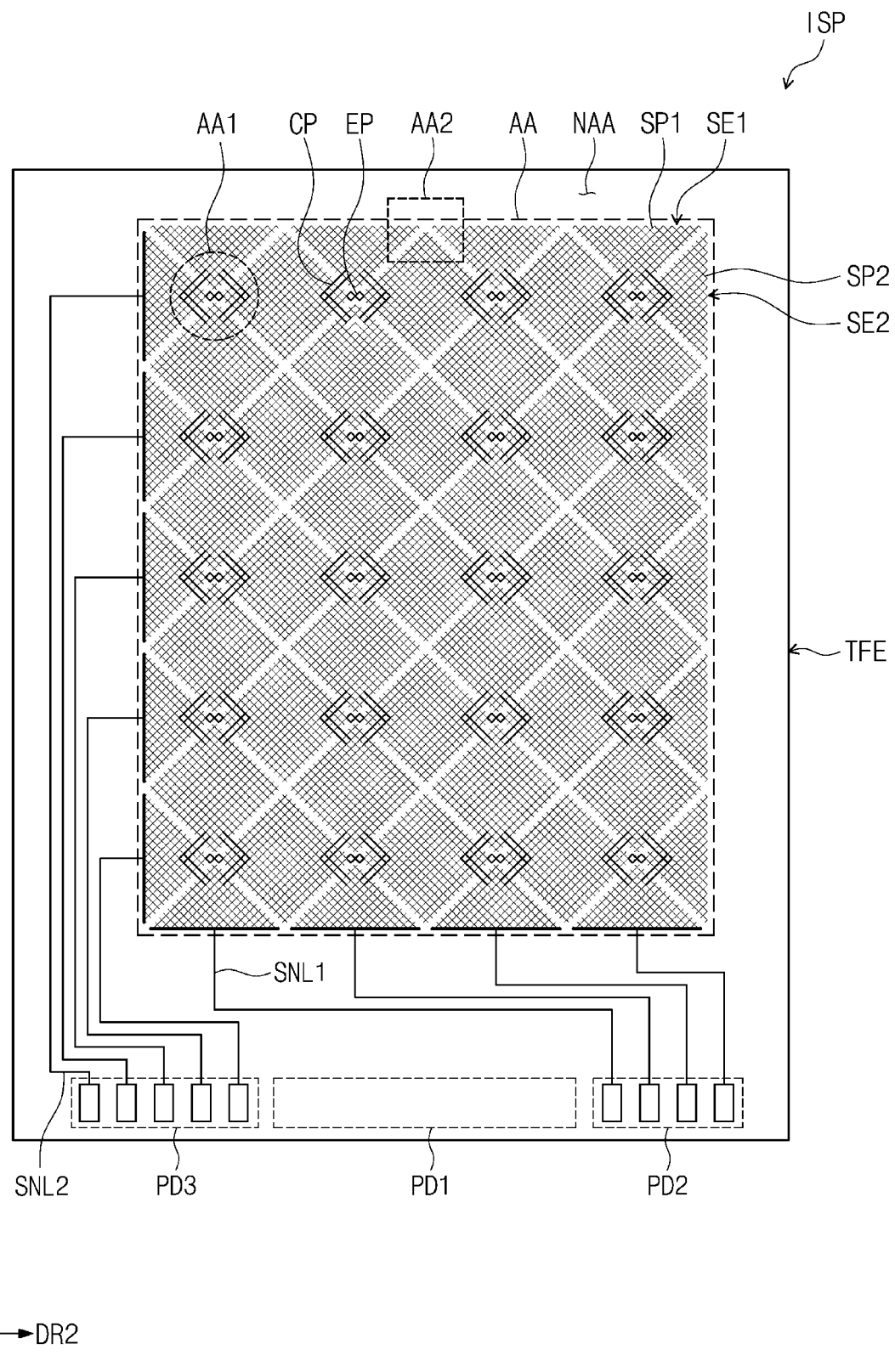
FIG. 6 is a plan view of the input sensing unit of FIG. 2.

FIG. 6 is a plan view of the input sensing unit of FIG. 2.

Referring to FIG. 6, the input sensing unit ISP may include a plurality of sensing electrodes SE1 and SE2, a plurality of wires SNL1 and SNL2, and a plurality of second and third pads PD2 and PD3. The sensing electrodes SE1 and SE2, the wires SNL1 and SNL2, and the second and third pads PD2 and PD3 may be disposed on the thin film encapsulation layer TFE.

A planar area of the input sensing unit ISP may include an active area AA and an inactive area NAA around the active area AA. The active area AA may overlap the display area DA, and the inactive area NAA may overlap the non-display area NDA. The sensing electrodes SE1 and SE2 may be disposed in the active area AA, and the second and third pads PD2 and PD3 may be disposed in the inactive area NAA.

The wires SNL1 and SNL2 may be connected to one ends of the sensing electrodes SE1 and SE2, respectively, and may extend to the inactive area NAA to be connected to the second and third pads PD2 and PD3, respectively. The second and third pads PD2 and PD3 may be connected to the printed circuit board PCB described above. The above-described sensing controller S-CON may be connected to the second and third pads PD2 and PD3 through the printed circuit board PCB.

The sensing electrodes SE1 and SE2 may include a plurality of first sensing electrodes SE1 which extend in the first direction DR1 and are arranged in the second direction DR2, and a plurality of second sensing electrodes SE2 which extend in the second direction DR2 and are arranged in the first direction DR1. The second sensing electrodes SE2 may extend to cross the first sensing electrodes SE1 in an insulated manner.

The wires SNL1 and SNL2 may include a plurality of first signal wires SNL1 connected to the first sensing electrodes SE1 and a plurality of second signal wires SNL2 connected to the second sensing electrodes SE2. The first signal wires SNL1 may be connected to the second pads PD2 and the second signal wires SNL2 may be connected to the third pads PD3.

Each of the first sensing electrodes SE1 may include a plurality of first sensors SP1 arranged in the first direction DR1 and a plurality of connection patterns CP connecting the first sensors SP1. Each of the connection patterns CP may be disposed between two first sensors SP1 adjacent to each other in the first direction DR1 to connect the two first sensors SP1.

Each of the second sensing electrodes SE2 may include a plurality of second sensors SP2 arranged in the second direction DR2 and a plurality of extension patterns EP extending from the second sensors SP2. Each of the extension patterns EP may be disposed between two second sensors SP2 adjacent to each other in the second direction DR2 to extend from the two second sensors SP2.

Each of the first sensors SP1 and each of the second sensors SP2 may have a mesh shape. The first sensors SP1 and the second sensors SP2 do not overlap each other and are spaced apart from each other, and may be alternately arranged. Capacitance may be formed by the first sensors SP1 and the second sensors SP2. Each of the extension patterns EP may not overlap each of the connection patterns CP.

FIG. 7 is an enlarged view of the first area AA1 of FIG. 6.

Referring to FIG. 7, each of the first and second sensors SP1 and SP2 may include a plurality of first branches BP1 extending in a first diagonal direction DDR1 and a plurality of second branches BP2 extending in a second diagonal direction DDR2 to have a mesh shape.

The first diagonal direction DDR1 may be defined as a direction crossing the first and second directions DR1 and DR2 in a plane defined by the first and second directions DR1 and DR2. The second diagonal direction DDR2 may be defined as a direction crossing the first diagonal direction DDR1 in the plane defined by the first and second directions DR1 and DR2.

The first branches BP1 and the second branches BP2 of each of the first and second sensors SP1 and SP2 may cross each other and be integrally formed. In this manner, rhombus-shaped touch openings TOP may be defined by the first branches BP1 and the second branches BP2.

The connection pattern CP may extend to connect the first sensors SP1 while not overlapping the extension pattern EP. The connection pattern CP may be connected to the first sensors SP1 through a plurality of contact holes TC-CH. The connection pattern CP may extend toward the first sensors SP1 via areas in which the connection pattern CP overlaps the second sensors SP2. The connection pattern CP may be defined as a first conductive pattern.

The extension pattern EP may be disposed between the first sensors SP1 and may extend from the second sensors SP2. The second sensors SP2 and the extension pattern EP may be integrally formed. The extension pattern EP may have a mesh shape. The extension pattern EP, the first sensors SP1, and the second sensors SP2 may be simultaneously patterned with the same material and formed in the same layer. The extension pattern EP, the first sensors SP1, and the second sensors SP2 may be disposed in a layer different from that of the connection pattern CP, and may be defined as a second conductive pattern.

The input sensing unit ISP may include a plurality of reflection patterns RPT disposed in the touch openings TOP. The reflection patterns RPT may extend from the first sensors SP1, the second sensors SP2, and the extension pattern EP. The reflection patterns RPT may reflect light provided from the light emitting areas PA. The configuration of the reflection patterns RPT will be described in more detail below.

The connection pattern CP may include a first extension part EX1 and a second extension part EX2 having a shape symmetrical to that of the first extension part EX1. The extension pattern EP may be disposed between the first extension part EX1 and the second extension part EX2. The first extension part EX1 may extend via an area where the first extension part EX1 overlaps one of the second sensors SP2, and may be connected to the first sensors SP1. The second extension part EX2 may extend via an area where the second extension part EX2 overlaps the other of the second sensors SP2, and may be connected to the first sensors SP1.

Hereinafter, the first sensors SP1 are defined as an upper first sensor SP1 and a lower first sensor SP1 according to a relative arrangement position. In addition, the second sensors SP2 are defined as a left second sensor SP2 and a right second sensor SP2 according to a relative arrangement position.

Predetermined portions of the first and second extension parts EX1 and EX2 adjacent to one sides of the first and second extension parts EX1 and EX2 may be connected to the lower first sensor SP1 through some of the contact holes TC-CH. Predetermined portions of the first and second extension parts EX1 and EX2 adjacent to the other sides of the first and second extension parts EX1 and EX2 may be connected to the upper first sensor SP1 through some other of the contact holes TC-CH.

The first extension part EX1 may include a first sub-extension part EX1_1 and a second sub-extension part EX1_2 extending in the first diagonal direction DDR1, a third sub-extension part EX1_3 and a fourth sub-extension part EX1_4 extending in the second diagonal direction DDR2, a first sub-conductive pattern SCP1 extending in the second diagonal direction DDR2, and a second sub-conductive pattern SCP2 extending in the first diagonal direction DDR1.

Predetermined portions of the first and second sub-extension parts EX1_1 and EX1_2 adjacent to one sides of the first and second sub-extension parts EX1_1 and EX1_2 may be connected to the lower first sensor SP1 through some of the contact holes TC-CH. Predetermined portions of the third and fourth sub-extension parts EX1_3 and EX1_4 adjacent to one sides of the third and fourth sub-extension parts EX1_3 and EX1_4 may be connected to the upper first sensor SP1 through some other of the contact holes TC-CH.

The other side of the first sub-extension part EX1_1 may extend from the other side of the third sub-extension part EX1_3, and the other side of the second sub-extension part EX1_2 may extend from the other side of the fourth sub-extension part EX1_4. The first sub-conductive pattern SCP1 may extend from the other side of the fourth sub-extension part EX1_4 in the second diagonal direction DDR2, and may extend to the first sub-extension part EX1_1. The second sub-conductive pattern SCP2 may extend from the other side of the second sub-extension part EX1_2 in the first diagonal direction DDR1, and may extend to the third sub-extension part EX1_3.

The first sub-extension part EX1_1, the second sub-extension part EX1_2, the third sub-extension part EX1_3, the fourth sub-extension part EX1_4, the first sub-conductive pattern SCP1, and the second sub-conductive pattern SCP2 may be integrally formed.

The first and second sub-extension parts EX1_1 and EX1_2 may extend to cross a predetermined number of second branches BP2 adjacent to the lower first sensor SP1 among the second branches BP2 of the right second sensor SP2. First branches BP1 of the right second sensor SP2 may not be disposed in some areas where the right second sensor SP2 overlaps the first and second sub-extension parts EX1_1 and EX1_2 and the second sub-conductive pattern SCP2.

The third and fourth sub-extension parts EX1_3 and EX1_4 may extend to cross a predetermined number of first branches BP1 adjacent to the upper first sensor SP1 among the first branches BP1 of the right second sensor SP2. Second branches BP2 of the right second sensor SP2 may not be disposed in some areas where the right second sensor SP2 overlaps the third and fourth sub-extension parts EX1_3 and EX1_4 and the first sub-conductive pattern SCP1.

The second extension part EX2 may include a fifth sub-extension part EX2_1 and a sixth sub-extension part EX2_2 extending in the second diagonal direction DDR2, a seventh sub-extension part EX2_3 and an eighth sub-extension part EX2_4 extending in the first diagonal direction DDR1, a third sub-conductive pattern SCP3 extending in the first diagonal direction DDR1, and a fourth sub-conductive pattern SCP4 extending in the second diagonal direction DDR2.

The left second sensor SP2 may have a structure symmetrical to that of the right second sensor SP2, and the second extension part EX2 may have a structure symmetrical to that of the first extension part EX1. Accordingly, descriptions of the fifth to eighth sub-extension parts EX2_1 to EX2_4 and the third and fourth sub-conductive patterns SCP3 and SCP4 will be omitted to avoid redundancy.

Figure 8:
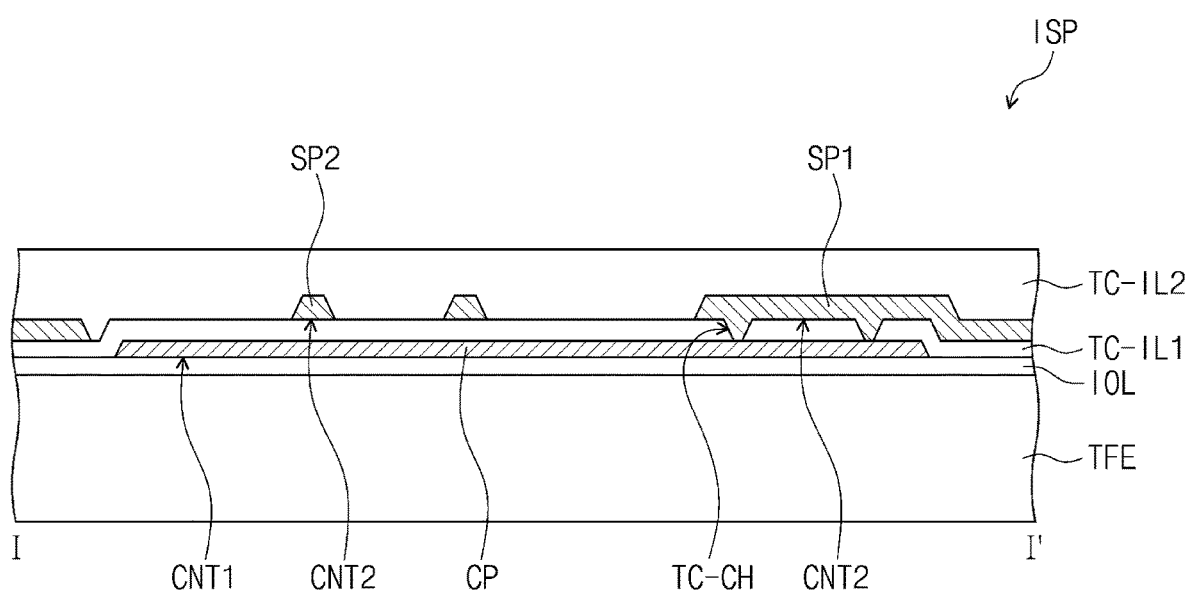
FIG. 8 is a cross-sectional view taken along line I-I' of FIG. 7.

FIG. 8 is a cross-sectional view taken along line I-I' of FIG. 7.

Referring to FIG. 8, an insulating layer IOL may be disposed on the thin film encapsulation layer TFE. The insulating layer IOL may be an inorganic layer. A first conductive pattern CNT1 may be disposed on the insulating layer IOL. The first conductive pattern CNT1 may include the connection pattern CP. A first insulating layer TC-IL1 may be disposed on the connection pattern CP and the insulating layer IOL. The first insulating layer TC-IL1 may be an inorganic layer or an organic layer.

A second conductive pattern CNT2 may be disposed on the first insulating layer TC-IL1. The second conductive pattern CNT2 may include the first sensors SP1 and the second sensors SP2. In addition, the second conductive pattern CNT2 may include the extension pattern EP integrally formed with the second sensors SP2.

The connection pattern CP may be connected to the first sensors SP1 through the plurality of contact holes TC-CH defined in the first insulating layer TC-IL1. A second insulating layer TC-IL2 may be disposed on the first insulating layer TC-IL1 to cover the first sensors SP1 and the second sensors SP2. The second insulating layer TC-IL2 may be an organic layer.

Figure 9:
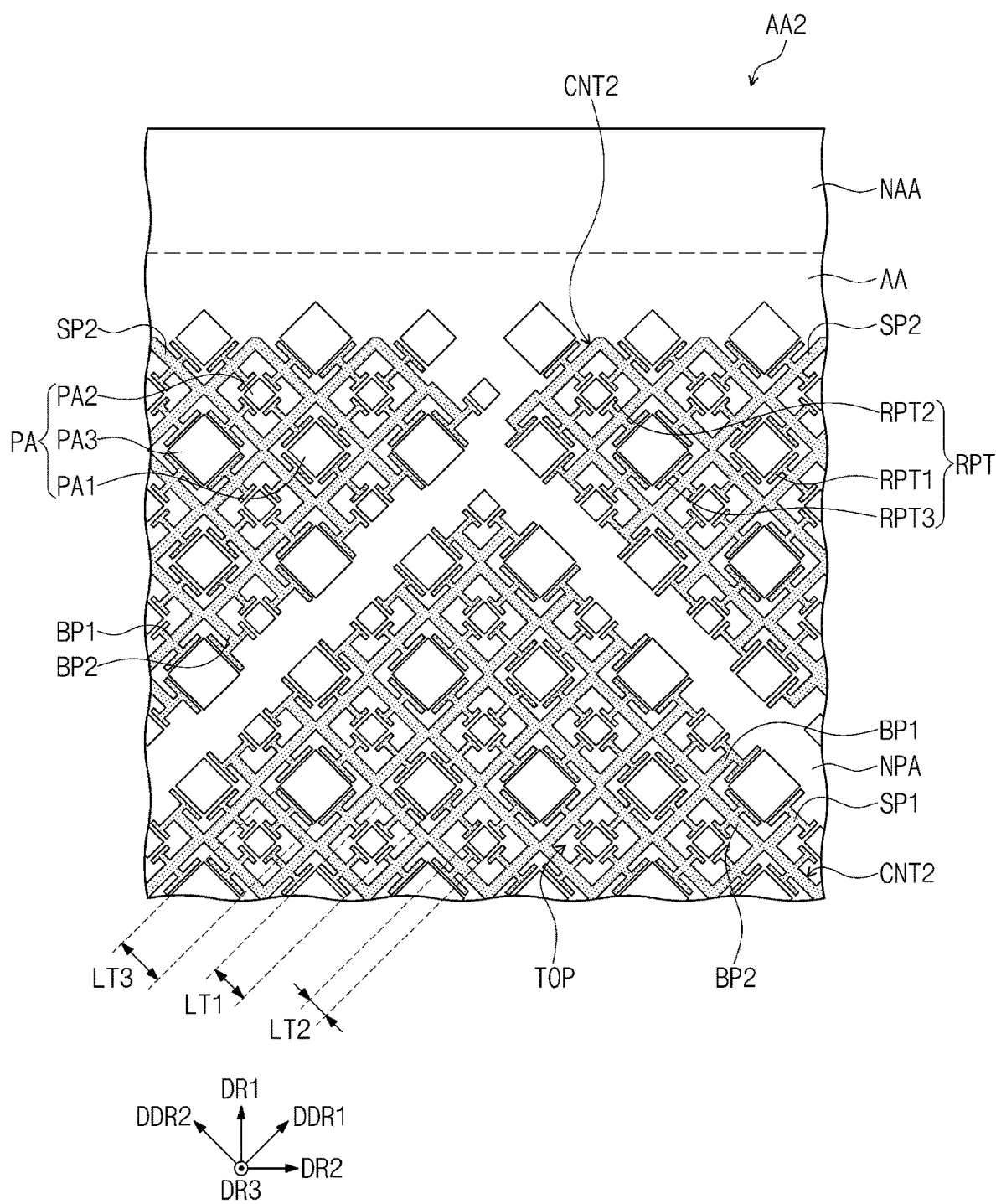
FIG. 9 is an enlarged view of the second area AA2 of FIG. 6.

FIG. 9 is an enlarged view of the second area AA2 of FIG. 6.

In FIG. 9, light emitting areas PA1, PA2, and PA3 are exemplarily illustrated together with first and second sensors SP1 and SP2.

Referring to FIG. 9, the light emitting areas PA may be arranged in the first diagonal direction DDR1 and the second diagonal direction DDR2. The first and second branches BP1 and BP2 may overlap the non-light emitting area NPA between the light emitting areas PA. More particularly, the first and second sensors SP1 and SP2 may be disposed in the non-light emitting area NPA. Because the first and second sensors SP1 and SP2 are disposed in the non-light emitting area NPA, light generated in the light emitting areas PA1, PA2, and PA3 may be emitted normally without being affected by the first and second sensors SP1 and SP2.

The light emitting areas PA may include a plurality of first light emitting areas PA1 displaying red, a plurality of second light emitting areas PA2 displaying green, and a plurality of third light emitting areas PA3 displaying blue. When viewed in a plane, each of the second light emitting areas PA2 has a smaller surface area than each of the first light emitting areas PA1, and each of the third light emitting areas PA3 has a larger surface area than each of the first light emitting areas PA1.

The light emitting areas PA1, PA2, and PA3 may each have substantially a rhombic shape. The touch openings TOP may overlap the light emitting areas PA1, PA2, and PA3. Each of the touch openings TOP may have substantially a rhombic shape corresponding to the shape of the light emitting areas PA1, PA2, and PA3.

When viewed in a plane, the reflection patterns RPT may be disposed in the touch openings TOP to be adjacent to the light emitting areas PA. The reflection patterns RPT may overlap the non-light emitting area NPA, and may be disposed between the light emitting areas PA and the second conductive pattern CNT2.

The reflection patterns RPT may be disposed to be adjacent to edges of the light emitting areas PA, and may extend along the edges of the light emitting areas PA. For example, the reflection patterns RPT may extend in the first diagonal direction DDR1 or the second diagonal direction DDR2 along the edges of the light emitting areas PA.

The reflection patterns RPT may include a plurality of first reflection patterns RPT1 adjacent to the first light emitting areas PA1, a plurality of second reflection patterns RPT2 adjacent to the second light emitting areas PA2, and a plurality of third reflection patterns RPT3 adjacent to the third light emitting areas PA3.

The first reflection patterns RPT1 may be disposed to be adjacent to edges of the first light emitting areas PA1 and may extend along the edges of the first light emitting areas PA1. The second reflection patterns RPT2 may be disposed to be adjacent to edges of the second light emitting areas PA2 and may extend along the edges of the second light emitting areas PA2. The third reflection patterns RPT3 may be disposed to be adjacent to edges of the third light emitting areas PA3 and may extend along the edges of the third light emitting areas PA3.

A first length LT1 of each of the first reflection patterns RPT1 in an extension direction thereof, a second length LT2 of each of the second reflection patterns RPT2 in an extension direction thereof, and a third length LT3 of each of the third reflection patterns RPT3 in an extension direction thereof may be different. The extension direction of each of the first, second, and third reflection patterns RPT1, RPT2, and RPT3 may be defined as the first diagonal direction DDR1 or the second diagonal direction DDR2.

The first, second, and third reflection patterns RPT1, RPT2, and RPT3 may have lengths respectively corresponding to the first, second, and third light emitting areas PA1, PA2, and PA3. For example, the first length LT1 may be longer than the second length LT2 and shorter than the third length LT3.

Figure 10:
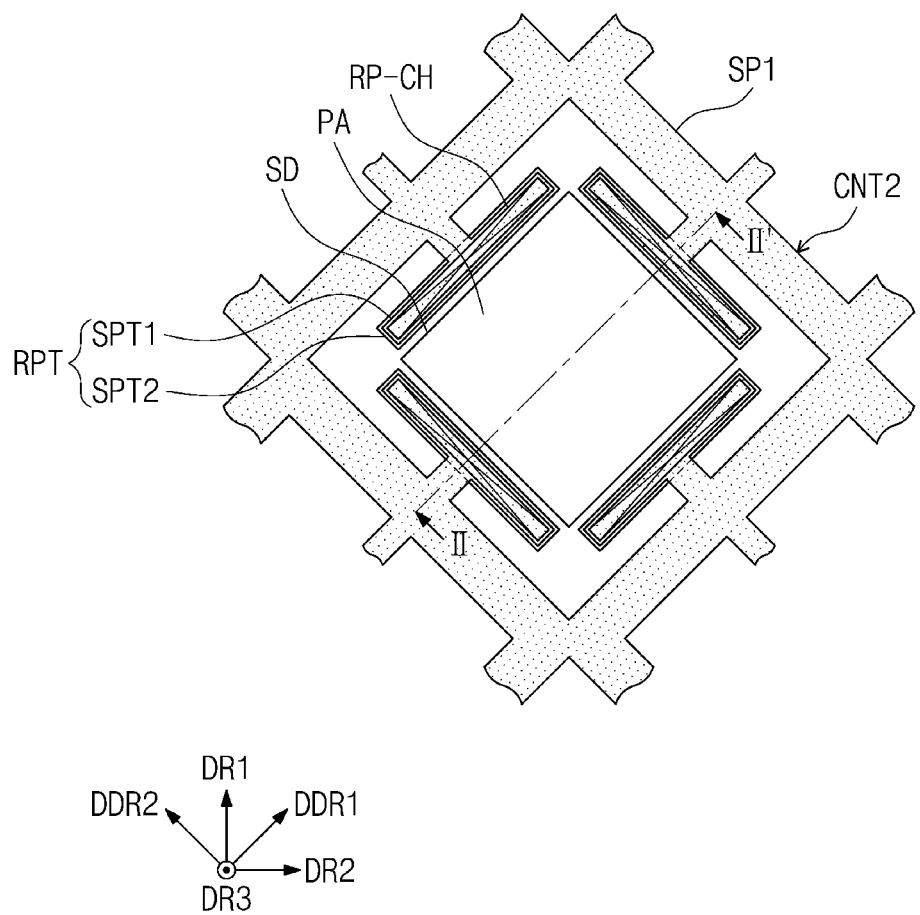
FIG. 10 is an enlarged view of one of the light emitting areas and the reflection patterns disposed around the light emitting area of FIG. 9.
Figure 11:
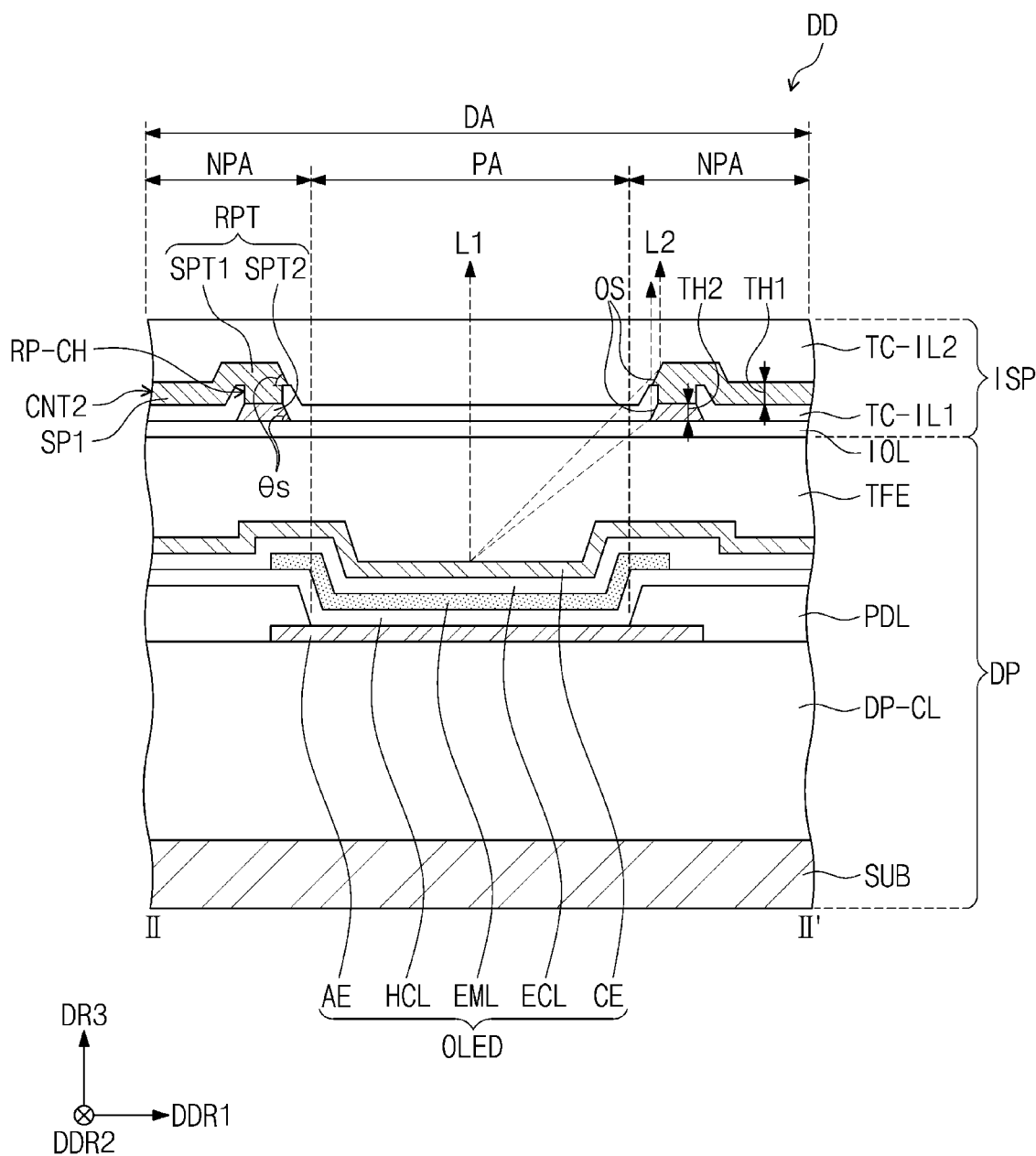
FIG. 11 is a cross-sectional view taken along line II-II' of FIG. 10.

FIG. 10 is an enlarged view of one of the light emitting areas and the reflection patterns disposed around the light emitting area illustrated in FIG. 9. FIG. 11 is a cross-sectional view taken along line II-II' of FIG. 10.

For example, a light emitting area PA and reflection patterns RPT illustrated in FIG. 10 may be the first light emitting area PA1 and the first reflection patterns RPT1 of FIG. 9, respectively. In particular, the light emitting area PA may be one of the first light emitting areas PA1 disposed in the touch openings TOP defined in the first sensor SP1. Although FIG. 10 exemplarily shows the reflection patterns RPT disposed around the light emitting area PA, other reflection patterns RPT illustrated in FIG. 9 may also have substantially the same configuration as the reflection patterns RPT illustrated in FIG. 10.

Referring to FIG. 10, the light emitting area PA may include a plurality of sides SD defining an edge of the light emitting area PA. For example, a light emitting area PA having substantially a rhombic shape may include four sides SD. The number of sides SD may vary depending on the shape of the light emitting area PA.

The reflection patterns RPT may be disposed to surround the light emitting area PA. The reflection patterns RPT may be spaced apart from each other and disposed to respectively correspond to the sides SD of the light emitting area PA. For example, four reflection patterns RPT may be disposed to be adjacent to the four sides SD, respectively.

Although the reflection patterns RPT according to the illustrated exemplary embodiment are illustrated as being spaced apart from each other and disposed to be adjacent to the light emitting area PA, however, the inventive concepts are not limited thereto. For example, in some exemplary embodiments, a single reflection pattern RPT may extend along the edge of the light emitting area PA to surround the light emitting area PA.

Referring to FIGS. 10 and 11, the reflection patterns RPT may be disposed in the non-light emitting area NPA. Each of the reflection patterns RPT may include a first sub-reflection pattern SPT1 and a second sub-reflection pattern SPT2 disposed below the first sub-reflection pattern SPT1. When viewed in a plane, the first sub-reflection pattern SPT1 may overlap substantially the entire second sub-reflection pattern SPT2.

The second sub-reflection pattern SPT2 may be disposed on the insulating layer IOL, and the first insulating layer TC-IL1 may be disposed on the second sub-reflection pattern SPT2. Accordingly, the second sub-reflection pattern SPT2 may be disposed on the same layer as the first conductive pattern CNT1 described above. The second sub-reflection pattern SPT2 may be formed by simultaneously patterning the second sub-reflection pattern SPT2 and the first conductive pattern CNT1 with the same material forming the first conductive pattern CNT1. The second sub-reflection pattern SPT2 may include a metal material capable of reflecting light.

The first sub-reflection pattern SPT1 may be disposed on the first insulating layer TC-IL1, and the second insulating layer TC-IL2 may be disposed on the first sub-reflection pattern SPT1. Accordingly, the first sub-reflection pattern SPT1 may be disposed on the same layer as the second conductive pattern CNT2. The first insulating layer TC-IL1 may be disposed between the first sub-reflection pattern SPT1 and the second sub-reflection pattern SPT2.

The first sub-reflection pattern SPT1 may extend from the second conductive pattern CNT2. The first sub-reflection pattern SPT1 may be formed by simultaneously patterning the first sub-reflection pattern SPT1 and the second conductive pattern CNT2 with the same material forming the second conductive pattern CNT2. The first sub-reflection pattern SPT1 may include a metal material capable of reflecting light.

One side surface OS of each of the reflection patterns RPT adjacent to (or facing) the light emitting area PA may have an inclined surface. For example, one side surfaces OS of the first and second sub-reflection patterns SPT1 and SPT2 adjacent to the light emitting area PA may have an inclined surface. The other side surfaces of the first and second sub-reflection patterns SPT1 and SPT2, which are opposite to the one side surfaces OS of the first and second sub-reflection patterns SPT1 and SPT2, may also have an inclined surface.

The one side surfaces OS may form inclination angles θs greater than about 60 degrees and less than about 90 degrees, respectively, with bottom surfaces of the first and second sub-reflection patterns SPT1 and SPT2, and more particularly, may form inclination angles θs from about 70 degrees to about 80 degrees. The inclination angles θs of the one side surfaces OS of the first and second sub-reflection patterns SPT1 and SPT2 may be the same, however, the inventive concepts are not limited thereto. For example, in some exemplary embodiments, the inclination angles θs of the one side surfaces OS of the first and second sub-reflection patterns SPT1 and SPT2 may be different from each other.

A first thickness TH1 of the first sub-reflection pattern SPT1 may be the same as a thickness of the second conductive pattern CNT2. A second thickness TH2 of the second sub-reflection pattern SPT2 may be the same as a thickness of the first conductive pattern CNT1. The first thickness TH1 may be greater than the second thickness TH2. For example, the first thickness TH1 may be from about 2700 Å to about 3300 Å, and the second thickness TH2 may be from about 1800 Å to about 2200 Å. However, the inventive concepts are not limited thereto, and the first thickness TH1 may be the same as the second thickness TH2 in other exemplary embodiments.

The first sub-reflection pattern SPT1 may be connected to the second sub-reflection pattern SPT2 through a contact hole RP-CH defined in the first insulating layer TC-IL1. The contact hole RP-CH may be provided as a single contact hole, and may extend in a direction along which each of the first and second sub-reflection patterns SPT1 and SPT2 extends. The contact hole RP-CH may have the same width as a top surface of the second sub-reflection pattern SPT2. Accordingly, the contact hole RP-CH may increase a contact area between the first sub-reflection pattern SPT1 and the second sub-reflection pattern SPT2.

The first sub-reflection pattern SPT1 may extend from the second conductive pattern CNT2 and be connected to the second sub-reflection pattern SPT2. Accordingly, a sensing signal applied to the second conductive pattern CNT2 may be applied to the first sub-reflection pattern SPT1 and the second sub-reflection pattern SPT2. In this manner, the first sub-reflection pattern SPT1 and the second sub-reflection pattern SPT2 may function as a sensing electrode.

A partial light L1 generated by the light emitting element OLED may travel in an upward direction to be emitted in an upward direction of the display device DD. Another partial light L2 generated by the light emitting element OLED may form a predetermined emission angle with the third direction DR3 and travel toward a side surface of the display device DD.

The light L2 may travel toward each of the reflection patterns RPT. The reflection pattern RPT may reflect the light L2 provided from the light emitting area PA towards the upward direction. For example, the light L2 may be reflected by the one side surfaces OS of the first and second sub-reflection patterns SPT1 and SPT2 towards the upward direction. Because the one side surfaces OS of the first and second sub-reflection patterns SPT1 and SPT2 have the inclined surface, more of the light L2 may travel in the upward direction. Accordingly, the front luminance of the display device DD may be improved.

When the reflection pattern RPT is not used and a separate refraction pattern for reflecting the light L2 is disposed in the input sensing unit ISP, the thickness of the display device DD may be increased. In addition, touch sensitivity may be degraded by the refraction pattern including an insulating material.

Since the display device DD according to an exemplary embodiment includes the reflection pattern RPT, which may be formed using the first and second conductive patterns CNT1 and CNT2 $d$ in the input sensing unit ISP, a separate refraction pattern may be obviated. In this manner, the thickness of the display device DD may be reduced, and degradation in touch sensitivity due to the refraction pattern may be prevented.

Figure 12:
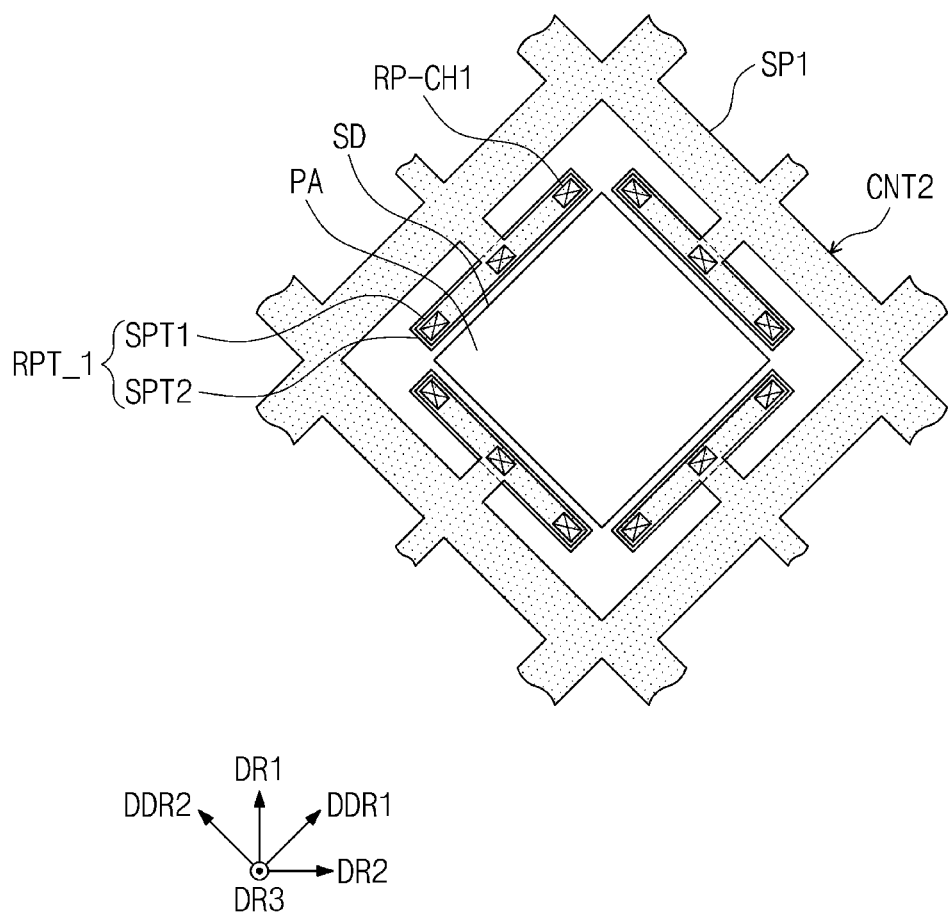
FIG. 12 illustrates reflection patterns according to another exemplary embodiment.

FIG. 12 illustrates reflection patterns according to another exemplary embodiment.

FIG. 12 exemplarily illustrates a plan view corresponding to FIG. 10. Hereinafter, reflection patterns RPT_1 will be described, focusing on a configuration different from that of the reflection patterns RPT illustrated in FIG. 10. In addition, components that are substantially the same as those described with reference to FIG. 10 will be indicated with the same reference numeral.

Referring to FIG. 12, each of the reflection patterns RPT_1 may include a first sub-reflection pattern SPT1 extending from the second conductive pattern CNT2 and a second sub-reflection pattern SPT2 disposed below the first sub-reflection pattern SPT1. The first and second sub-reflection patterns SPT1 and SPT2 may have substantially the same configuration as the first and second sub-reflection patterns SPT1 and SPT2 illustrated in FIG. 10.

While the first sub-reflection pattern SPT1 of FIG. 10 is connected to the second sub-reflection pattern SPT2 through a single contact hole RP-CH, the first sub-reflection pattern SPT1 according to the illustrated exemplary embodiment may be to the second sub-reflection pattern SPT2 through a plurality of contact holes RP-CH1, as shown in FIG. 12.

Figure 13:
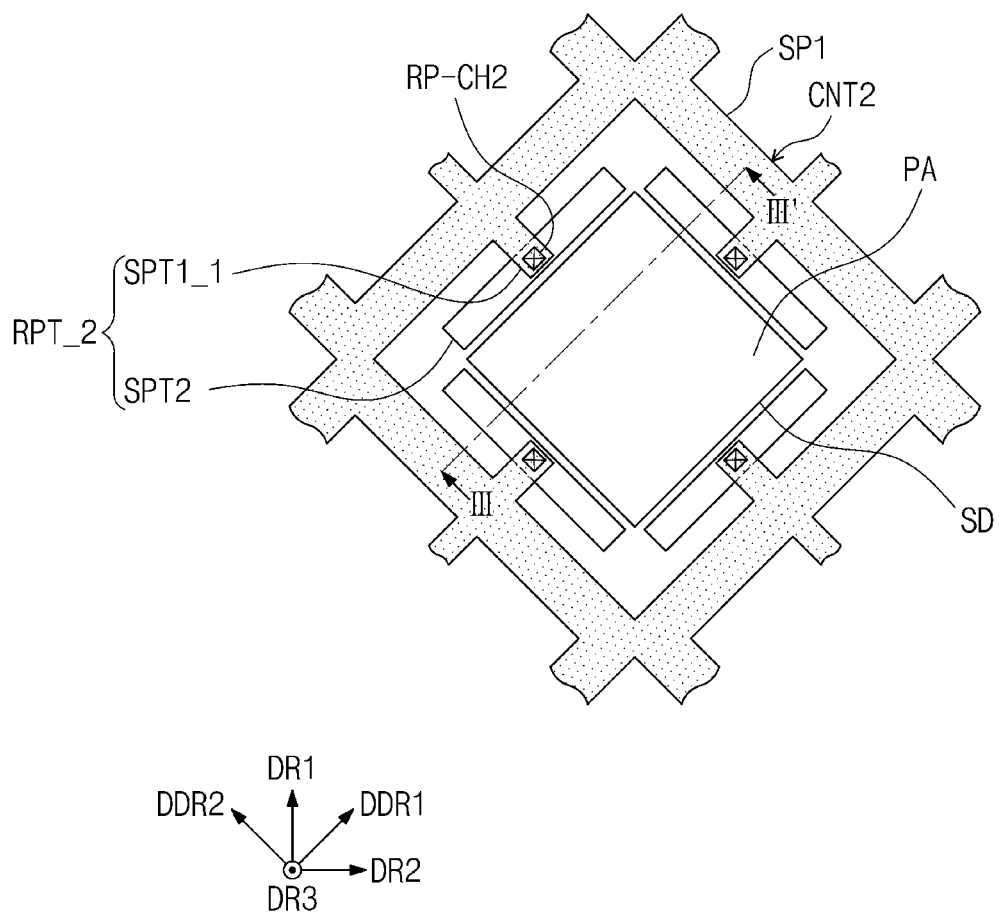
FIG. 13 illustrates reflection patterns according to another exemplary embodiment.
Figure 14:
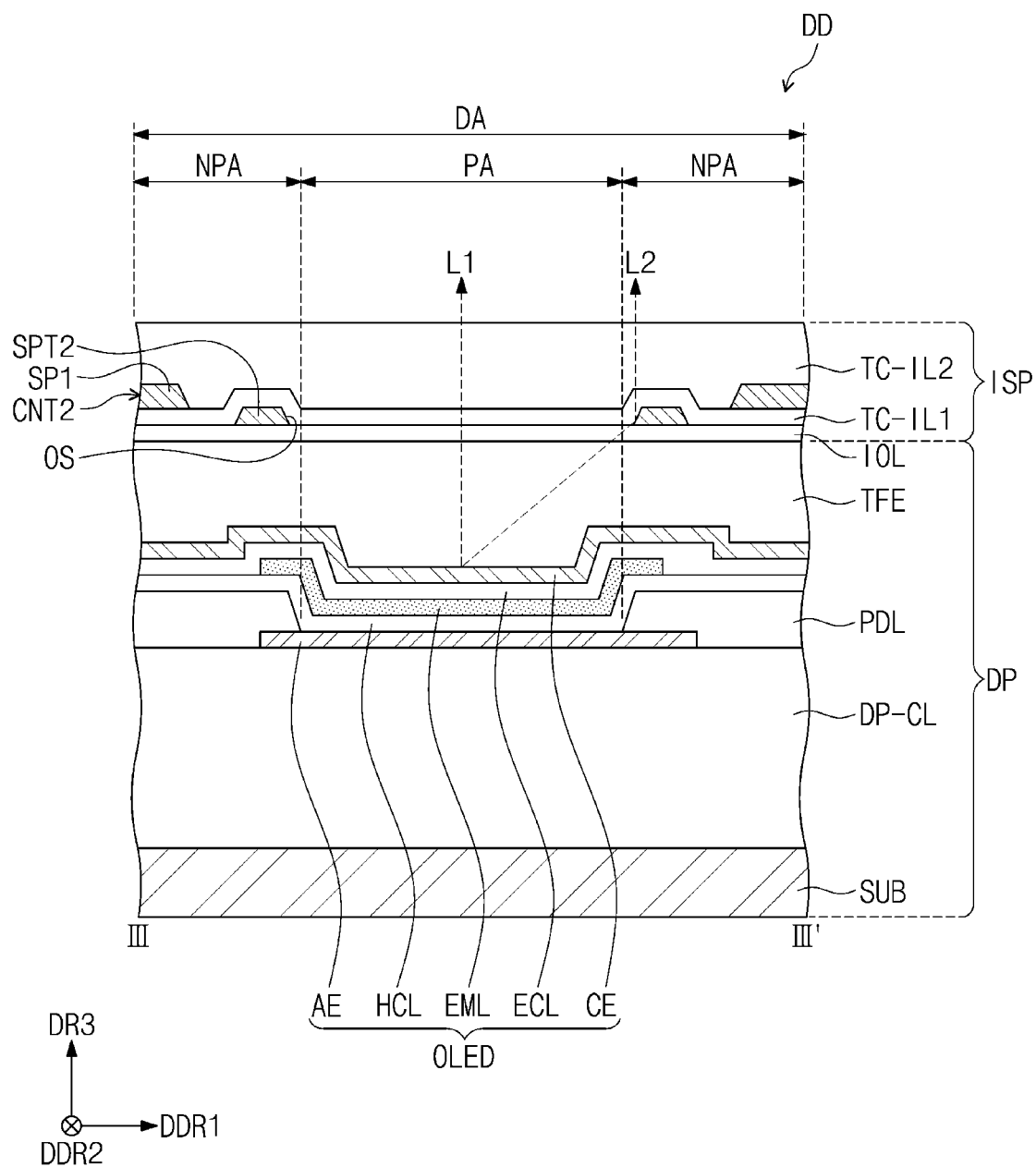
FIG. 14 is a cross-sectional view taken along line III-III' of FIG. 13.

FIG. 13 illustrates reflection patterns according to another exemplary embodiment. FIG. 14 is a cross-sectional view taken along line of FIG. 13.

FIG. 13 exemplarily illustrates a plan view corresponding to FIG. 10, and FIG. 14 exemplarily illustrates a cross-sectional view corresponding to FIG. 11. Hereinafter, reflection patterns RPT_2 will be described, focusing on a configuration different from that of the reflection patterns RPT illustrated in FIGS. 10 and 11. In addition, the components that are substantially the same as those described with reference to FIG. 10 will be indicated the same reference numeral.

Referring to FIGS. 13 and 14, each of the reflection patterns RPT_2 may include a first sub-reflection pattern SPT1_1 extending from the second conductive pattern CNT2 and a second sub-reflection pattern SPT2 disposed below the first sub-reflection pattern SPT1_1. The second sub-reflection pattern SPT2 may have substantially the same configuration as the second sub-reflection pattern SPT2 illustrated in FIG. 10.

When viewed in a plane, the first sub-reflection pattern SPT1_1 may partially overlap the second sub-reflection pattern SPT2. For example, the first sub-reflection pattern SPT1_1 may overlap a central portion of the second sub-reflection pattern SPT2. The first sub-reflection pattern SPT1_1 may be connected to the second sub-reflection pattern SPT2 through a single contact hole RP-CH2.

The second sub-reflection pattern SPT2 may reflect the light L2 provided from the light emitting area PA to allow the light L2 to travel in an upward direction. The light L2 may be reflected by one side surface OS of the second sub-reflection patterns SPT2 towards the upward direction.

Figure 15:
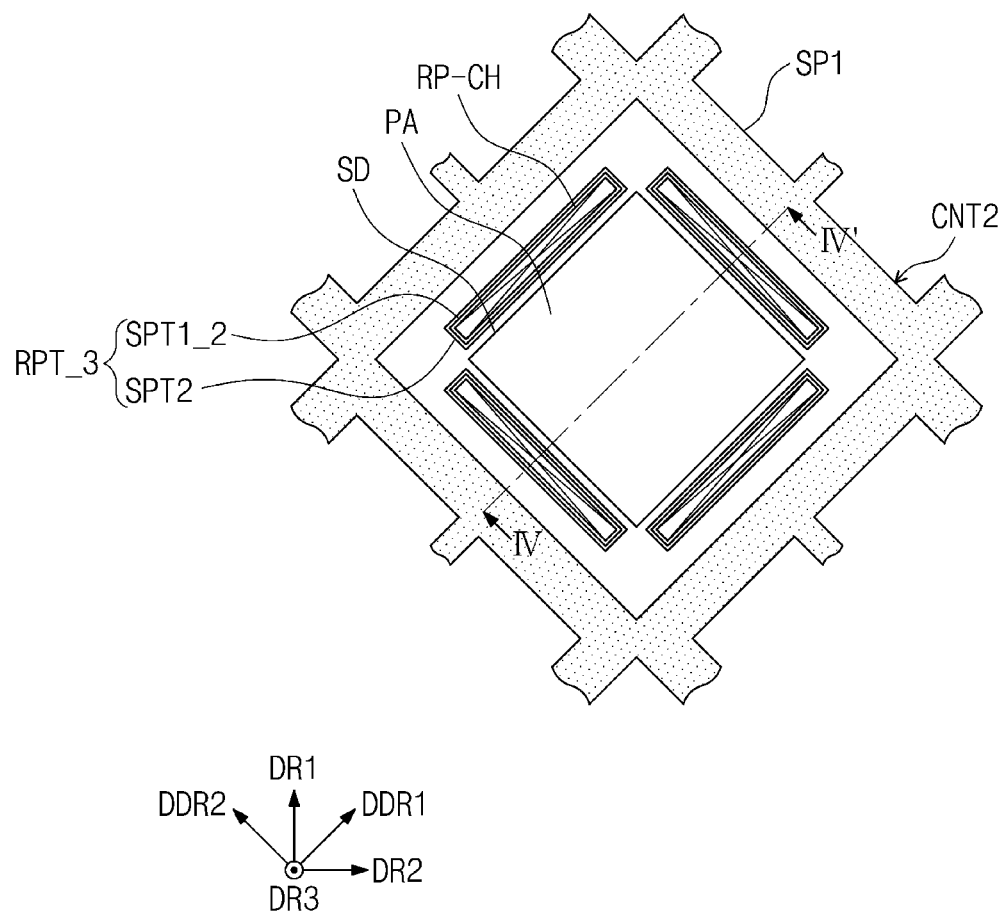
FIG. 15 illustrates reflection patterns according to another exemplary embodiment.
Figure 16:
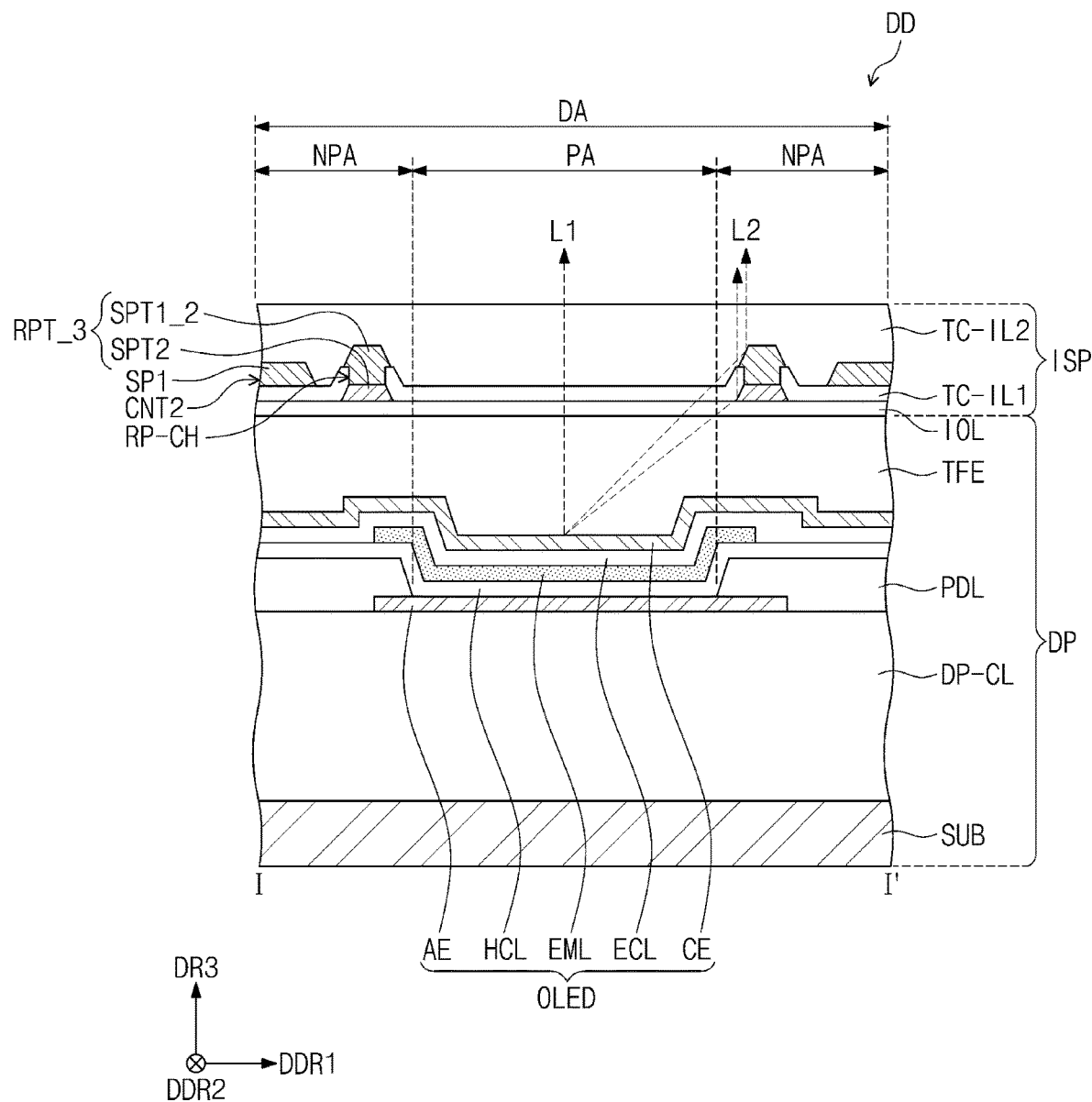
FIG. 16 is a cross-sectional view taken along line IV-IV' of FIG. 15.

FIG. 15 illustrates reflection patterns according to another exemplary embodiment. FIG. 16 is a cross-sectional view taken along line IV-IV' of FIG. 15.

FIG. 15 illustrates a plan view corresponding to FIG. 10, and FIG. 16 illustrates a cross-sectional view corresponding to FIG. 11. Hereinafter, reflection patterns RPT_3 will be described, focusing on a configuration different from that of the reflection patterns RPT illustrated in FIGS. 10 and 11.

Referring to FIGS. 15 and 16, each of the reflection patterns RPT_3 may include a first sub-reflection pattern SPT1_2 and a second sub-reflection pattern SPT2 disposed below the first sub-reflection pattern SPT1_2.

Unlike the first sub-reflection patterns SPT1 described above, the first sub-reflection pattern SPT1_2 according to the illustrated exemplary embodiment may not extend from the second conductive pattern CNT2. The first sub-reflection pattern SPT1_2 may be spaced apart from and insulated from the second conductive pattern CNT2.

The first sub-reflection pattern SPT1_2 may be connected to the second sub-reflection pattern SPT2 through a contact hole RP-CH. The light L2 may be reflected by one side surfaces OS of the first and second sub-reflection patterns SPT1_2 and SPT2 to travel in the upward direction.

Figure 17:
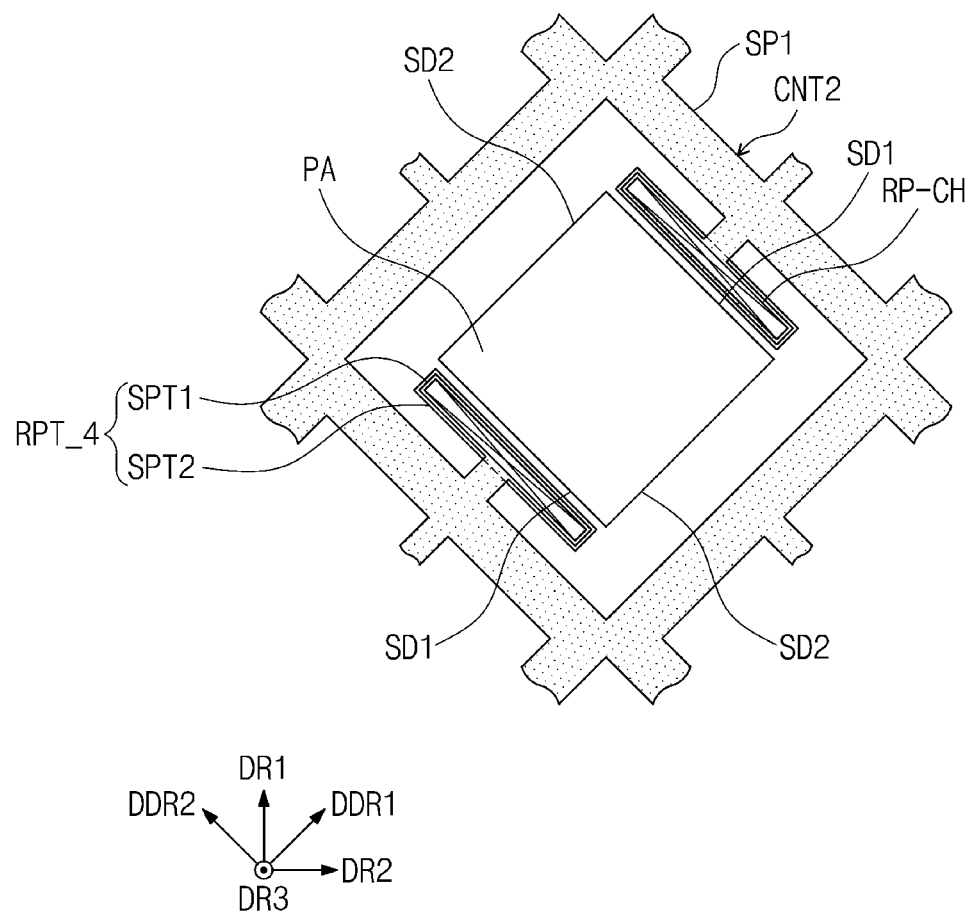
FIG. 17 illustrates reflection patterns according to another exemplary embodiment.

FIG. 17 illustrates reflection patterns according to another exemplary embodiment.

FIG. 17 exemplarily illustrates a plan view corresponding to FIG. 10. Hereinafter, reflection patterns RPT_4 will be described, focusing on a configuration different from that of the reflection patterns RPT illustrated in FIG. 10.

Referring to FIG. 17, the light emitting area PA may include first sides SD1 which extend in the second diagonal direction DDR2 and are opposite to each other in the first diagonal direction DDR1, and second sides SD2 which extend in the first diagonal direction DDR1 and are opposite to each other in the second diagonal direction DDR2. The first sides SD1 and the second sides SD2 may define the edge of the light emitting area PA.

The reflection patterns RPT_4 may be disposed to be adjacent to the first sides SD1, respectively. The reflection patterns RPT_4 may not be disposed near the second sides SD2. First and second sub-reflection patterns SPT1 and SPT2 of each of the reflection patterns RPT_4 may have the same configuration as the first and second sub-reflection patterns SPT1 and SPT2 illustrated in FIG. 10.

Figure 19:
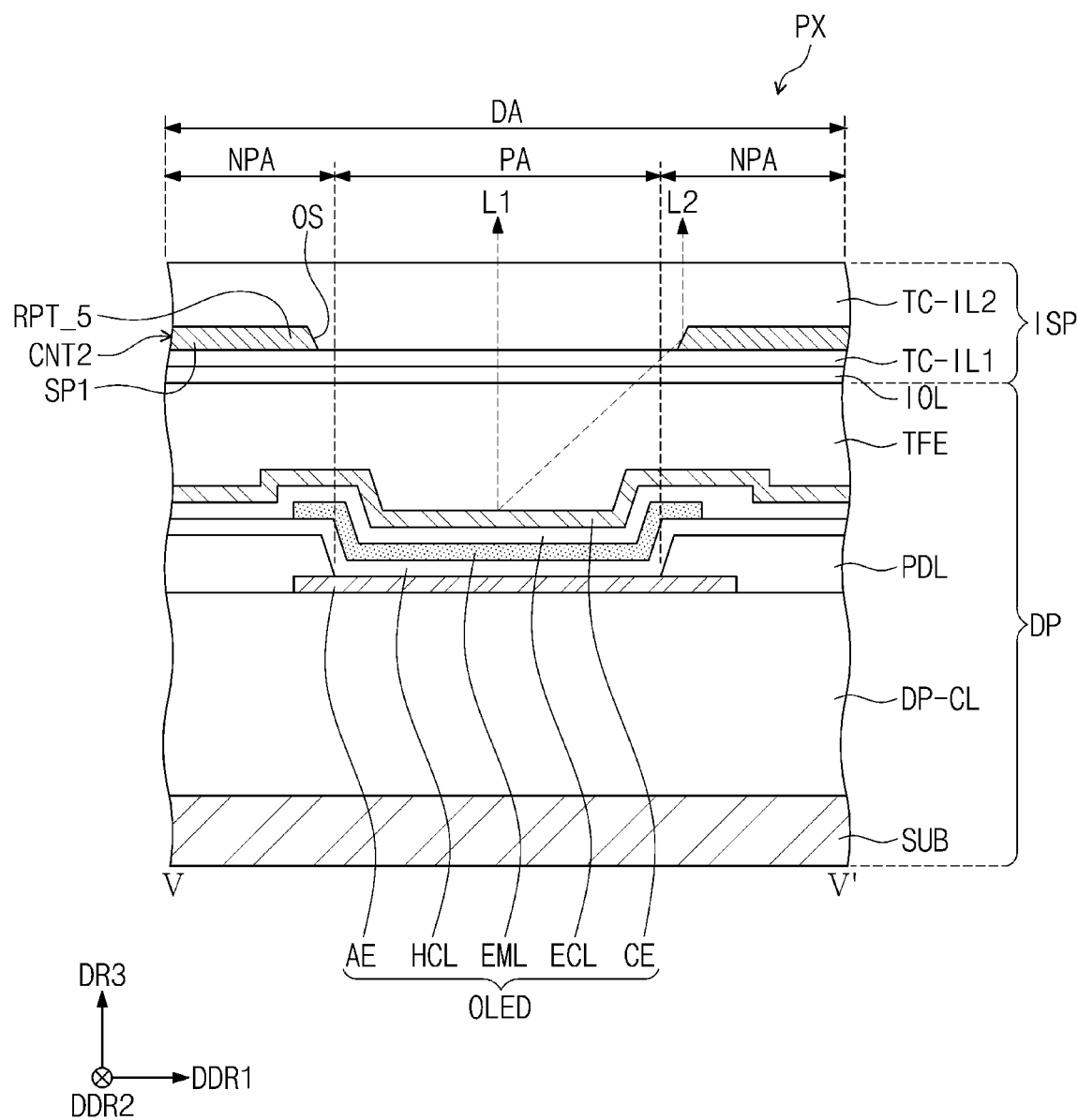
FIG. 19 is a cross-sectional view taken along line V-V' of FIG. 18.

FIG. 18 illustrates reflection patterns according to another exemplary embodiment. FIG. 19 is a cross-sectional view taken along line V-V' of FIG. 18.

FIG. 18 exemplarily illustrates a plan view corresponding to FIG. 10, and FIG. 19 exemplarily illustrates a cross-sectional view corresponding to FIG. 11. Hereinafter, reflection patterns RPT_5 will be described, focusing on a configuration different from that of the reflection patterns RPT illustrated in FIGS. 10 and 11.

Referring to FIGS. 18 and 19, the reflection patterns RPT_5 may extend from the second conductive pattern CNT2 and may extend along the edge of the light emitting area PA. The reflection patterns RPT_5 may be disposed to be adjacent to the sides SD of the light emitting area PA, respectively.

The reflection patterns RPT_5 may be substantially the same as the first sub-reflection patterns SPT1 illustrated in FIGS. 10 and 11, except that the reflection patterns RPT_5 may not include the second sub-reflection patterns SPT2.

The reflection patterns RPT_5 may reflect the light L2 provided from the light emitting area PA to allow the light L2 to travel in an upward direction. The light L2 may be reflected by one side surfaces OS of the reflection patterns RPT_5 to travel in the upward direction.

According to exemplary embodiments, the reflection pattern capable of reflecting light is disposed between the sensor and the light emitting area, and the reflection pattern reflects light provided from the light emitting area to allow the light to travel upward, so that the front luminance of the display device may be improved.

In addition, since the display device according to exemplary embodiments may obviate the use of a separate refraction pattern to reflect light, the thickness of the display device may be reduced and degradation in touch sensitivity due to a refraction pattern may be prevented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel including a light emitting area and a non-light emitting area around the light emitting area;
    a first conductive pattern disposed in the non-light emitting area;
    a second conductive pattern disposed on the first conductive pattern; and
    a reflection pattern overlapping the non-light emitting area and disposed between the light emitting area and the second conductive pattern, at least a portion of the reflection pattern extending from the second conductive pattern,
    wherein the reflection pattern extends parallel to the second conductive pattern, one side of the light emitting area extends in one direction, and the reflection pattern facing the one side of the light emitting area extends parallel to the one side of the light emitting area.

2. The display device of claim 1, wherein:
    the reflection pattern is provided in plurality, and
    the plurality of reflection patterns are spaced apart from each other and are disposed to correspond to each side of the light emitting area, respectively.

3. The display device of claim 2, wherein the light emitting area is provided in plurality and comprises:
    a first light emitting area;
    a second light emitting area having a surface area smaller than a surface area of the first light emitting area; and
    a third light emitting area having a surface area larger than the surface area of the first light emitting area.

4. The display device of claim 3, wherein the reflection patterns comprise:
    a plurality of first reflection patterns disposed adjacent to an edge of the first light emitting area to extend along the edge of the first light emitting area;
    a plurality of second reflection patterns disposed adjacent to an edge of the second light emitting area to extend along the edge of the second light emitting area; and
    a plurality of third reflection patterns disposed adjacent to an edge of the third light emitting area to extend along the edge of the third light emitting area, and
    wherein a first length of each of the first reflection patterns along an extension direction thereof, a second length of each of the second reflection patterns along an extension direction thereof, and a third length of each of the third reflection patterns along an extension direction thereof are different from each other.

5. The display device of claim 4, wherein the first length is greater than the second length and less than the third length.

6. The display device of claim 1, wherein the reflection pattern comprises:
    a first sub-reflection pattern; and
    a second sub-reflection pattern disposed below the first sub-reflection pattern.

7. The display device of claim 6, further comprising an insulating layer disposed between the first sub-reflection pattern and the second sub-reflection pattern,
    wherein the first sub-reflection pattern is connected to the second sub-reflection pattern through a contact hole defined in the insulating layer.

8. The display device of claim 7, wherein the contact hole has the same width as a top surface of the second sub-reflection pattern.

9. The display device of claim 7, wherein the contact hole is provided in plurality.

10. The display device of claim 6, wherein the first sub-reflection pattern is disposed on the same layer as the second conductive pattern and extends from the second conductive pattern.

11. The display device of claim 6, wherein the second sub-reflection pattern is disposed on the same layer as the first conductive pattern.

12. The display device of claim 6, wherein the first sub-reflection pattern overlaps a portion of the second sub-reflection pattern.

13. The display device of claim 6, wherein the first sub-reflection pattern is spaced apart from the second conductive pattern and is insulated from the second conductive pattern.

14. The display device of claim 1, wherein one side surface of the reflection pattern adjacent to the light emitting area is inclined.

15. The display device of claim 14, wherein the one side surface of the reflection pattern forms an inclination angle of about 70 degrees to about 80 degrees with a bottom surface of the reflection pattern.

16. The display device of claim 1, wherein the reflection pattern is configured to reflect light provided from the light emitting area in an upward direction.

17. The display device of claim 1, wherein the light emitting area comprises:
    first sides opposite to each other in a first diagonal direction; and
    second sides opposite to each other in a second diagonal direction crossing the first diagonal direction,
    wherein the reflection pattern is provided in plurality, and
    wherein the reflection patterns are disposed to be adjacent to the first sides, respectively, and are not disposed near the second sides.

18. A display device comprising:
a display panel including a light emitting area and a non-light emitting area around the light emitting area;
a first conductive pattern disposed in the non-light emitting area;
a second conductive pattern disposed on the first conductive pattern;
a first sub-reflection pattern disposed between the second conductive pattern and the light emitting area; and
a second sub-reflection pattern disposed below the first sub-reflection pattern,
wherein one side surface of the first sub-reflection pattern adjacent to the light emitting area and one side surface of the second sub-reflection pattern adjacent to the light emitting area are inclined, and
wherein the first sub-reflection pattern is disposed on the same layer as the second conductive pattern and extends from the second conductive pattern.

19. The display device of claim 18, wherein
the second sub-reflection pattern is disposed on the same layer as the first conductive pattern.

* * * * *